United States Patent
Kim et al.

(10) Patent No.: US 9,515,686 B2
(45) Date of Patent: Dec. 6, 2016

(54) SIGNAL TRANSMITTING CIRCUIT USING COMMON CLOCK, AND STORAGE DEVICE THEREWITH

(71) Applicants: Sung-Ha Kim, Yongin-si (KR); Sanghune Park, Seongnam-si (KR); Hwaseok Oh, Yongin-si (KR)

(72) Inventors: Sung-Ha Kim, Yongin-si (KR); Sanghune Park, Seongnam-si (KR); Hwaseok Oh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/822,003

(22) Filed: Aug. 10, 2015

(65) Prior Publication Data

US 2016/0043755 A1 Feb. 11, 2016

Related U.S. Application Data

(60) Provisional application No. 62/035,579, filed on Aug. 11, 2014.

(30) Foreign Application Priority Data

Oct. 10, 2014 (KR) ........................ 10-2014-0136834

(51) Int. Cl.
*H04B 1/04* (2006.01)
*H03M 9/00* (2006.01)
*G06F 13/40* (2006.01)

(52) U.S. Cl.
CPC ............. *H04B 1/0483* (2013.01); *G06F 13/40* (2013.01); *H03M 9/00* (2013.01)

(58) Field of Classification Search
CPC ........... H04B 1/02; H04B 1/04; H04B 1/0483; H04L 7/00; H04L 7/0091; H04L 7/027; H04L 7/033; H04L 7/04; H04L 7/06; H03M 9/00; G06F 13/40
USPC ............... 375/295, 306, 307, 354, 356, 371, 373,375/376; 370/350, 516, 518; 713/400, 503, 600
See application file for complete search history.

(56) References Cited

U.S. PATENT DOCUMENTS

| | | | |
|---|---|---|---|
| 7,301,996 B1* | 11/2007 | Chi ....................... | G06F 13/423 327/161 |
| 7,729,415 B1 | 6/2010 | Possley | |
| 7,885,320 B1* | 2/2011 | Groen ................... | H04J 3/0685 375/219 |
| 8,411,703 B1 | 4/2013 | Cory | |

(Continued)

FOREIGN PATENT DOCUMENTS

| | | |
|---|---|---|
| EP | 0845735 A1 | 6/1998 |
| EP | 1982205 A2 | 10/2008 |

(Continued)

*Primary Examiner* — Young T Tse
(74) *Attorney, Agent, or Firm* — Harness, Dickey & Pierce, P.L.C.

(57) ABSTRACT

A transmitting circuit includes a plurality of transmitters, an operation clock generator, and a clock divider. Each of the transmitters outputs data serially. The operation clock generator generates an operation clock signal. The clock divider divides the operation clock signal to generate a symbol clock signal. The plurality of transmitters receives the operation clock signal and the symbol clock signal in common. A clock signal provided to one transmitter is equally synchronized with a clock signal provided to other transmitter(s).

20 Claims, 12 Drawing Sheets

(56) References Cited

U.S. PATENT DOCUMENTS

| | | | |
|---|---|---|---|
| 8,649,461 B2 | 2/2014 | Shumarayev | |
| 8,749,535 B2 | 6/2014 | Kim et al. | |
| 8,760,325 B2 | 6/2014 | Ryan | |
| 9,071,258 B1 * | 6/2015 | Shiraishi | H03M 9/00 |
| 2007/0028013 A1 * | 2/2007 | Nonoyama | G06F 13/4072 |
| | | | 710/33 |
| 2011/0239031 A1 * | 9/2011 | Ware | G11C 7/04 |
| | | | 713/500 |
| 2011/0246810 A1 | 10/2011 | Wessel et al. | |
| 2012/0030438 A1 | 2/2012 | Shafai et al. | |
| 2012/0314778 A1 * | 12/2012 | Salustri | H04N 7/22 |
| | | | 375/240.28 |

FOREIGN PATENT DOCUMENTS

| | | |
|---|---|---|
| KR | 1020100038825 A | 4/2010 |
| KR | 101363798 B1 | 2/2014 |

* cited by examiner

SIGNAL TRANSMITTING CIRCUIT USING COMMON CLOCK, AND STORAGE DEVICE THEREWITH

CROSS-REFERENCE TO RELATED APPLICATIONS

The present application claims priority under 35 U.S.C. §119 to U.S. Provisional Application No. 62/035,579 filed on Aug. 11, 2014, and Korean Patent Application No. 10-2014-0136834 filed on Oct. 10, 2014, the entire contents of both of which are incorporated herein by reference.

BACKGROUND

1. Field of the Invention

Example embodiments relate to interfacing, and more particularly, at least some example embodiments relate to a signal transmitting circuit for interfacing between electronic devices and a storage device including the signal transmitting circuit.

2. Description of the Related Art

An electronic device may execute functions independently without interaction with other electronic devices. In addition, electronic devices may exchange data with another electronic device when executing functions. Interfaces may be used to exchange data between two or more electronic devices. Different types of electronic devices may utilize different types of interface protocols.

For instance, the mobile industry processor interface (MIPI) alliance has proposed the interface protocol in which the "UniPro" is used as a link layer to standardize an interface process of a mobile device. The UniPro supports a physical layer called "PHY". A physical layer of an interface circuit, such as the PHY, may include a transmitter and a receiver that are used to exchange data with another electronic device.

A transmitter transmits signals and data to a receiver. According to some interface protocols, a plurality of transmitters may be used to increase bandwidth associated with a data transmission. When the plurality of transmitters is used, each of the transmitters may independently operate regardless of whether other transmitters operate.

In an attempt to synchronize the transmitters, a clock signal may be transmitted to each of the transmitters. However, when each of the plurality of transmitters operates independently, the clock signal provided to one transmitter may not be equally synchronized with a clock signal provided to another transmitter. Thus, when each of the plurality of transmitters operates independently, timing of the data transmission may be skewed between lanes respectively corresponding to the plurality of transmitters. As a result, an error may occur in the data transmission.

SUMMARY

Some example embodiments are related to a transmitting circuit.

In some example embodiments, the transmitting circuit may include a plurality of transmitters, an operation clock generator, and a clock divider. Each of the transmitters may output data serially. The operation clock generator may generate an operation clock signal. The clock divider may divide the operation clock signal to generate a symbol clock signal. The plurality of transmitters may receive the operation clock signal and the symbol clock signal in common. Each of the transmitters may include a serializer configured to receive parallel data in synchronization with the symbol clock signal, and to serialize the received parallel data to generate serial data in synchronization with the operation clock signal, digital logic configured to receive original data, and to extract data of symbol unit from the original data to generate the parallel data to be provided to the serializer based on the symbol clock signal provided through the serializer, and a driver configured to output the serial data.

In other example embodiments, the transmitting circuit may include a common clock block and a transmission block. The common clock block may output an operation clock signal and a symbol clock signal. The operation clock signal may be used to serialize parallel data. The symbol clock signal may be generated by dividing the operation clock signal, and may be used to extract data of symbol unit. The transmission block may include a plurality of transmitters. The plurality of transmitters may receive the operation clock signal and the symbol clock signal in common. Each of the transmitters may receive original data, generate the parallel data by extracting the data of the symbol unit from the original data based on the symbol clock signal, serialize the generated parallel data in synchronization with the operation clock signal, and output the serialized data.

Some example embodiments are related to a storage device.

In some example embodiments, the storage device may include a memory controller, a nonvolatile memory, and an interface circuit. The nonvolatile memory may store data according to a control of the memory controller. The interface circuit may serially output the stored data in compliance with an interface protocol that uses a physical layer. The interface circuit may include a plurality of transmitters included in the physical layer, an operation clock generator configured to generate an operation clock signal, and a clock divider configured to divide the operation clock signal to generate a symbol clock signal. The operation clock signal and the symbol clock signal are provided to the transmitters in common. Each of the transmitters may receive the stored data, generate parallel data by extracting data of symbol unit from the received data based on the symbol clock signal, generate serial data by serializing the generated parallel data in synchronization with the operation clock signal, and output the serial data.

Some example embodiments relate to a transmitting circuit configured to serially output data in response to an operation clock signal.

In some example embodiments, the transmitting circuit includes a plurality of transmitters and a common clock circuit configured to provide the symbol clock signal to the serializer such that a same symbol clock signal is provided to each of the plurality of transmitters in the transmitting circuit.

In some example embodiments, each of the transmitters includes a serializer configured to convert parallel data to serial data in response to the operation clock signal, a logic circuit configured to convert a unit of received original data to extracted data, and to provide the extracted data to the serializer in response to a symbol clock signal, and an operation clock buffer configured to selectively transmit the operation clock signal to the serializer based on one or more external input signals.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION OF EMBODIMENTS

Figure 1:
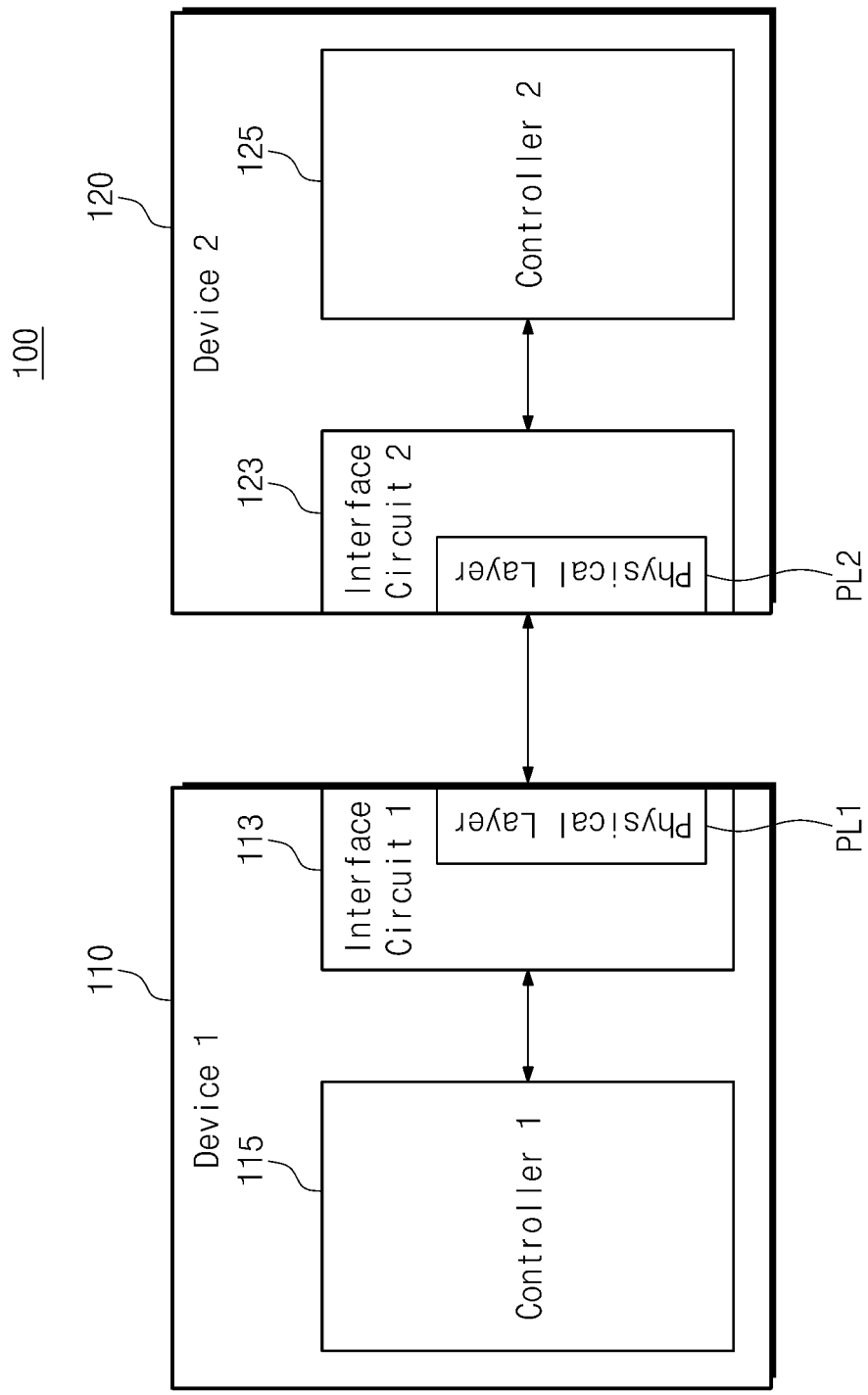
FIG. 1 is a block diagram illustrating an electronic system including two electronic devices which are connected to each other.

Example embodiments will be described in detail with reference to the accompanying drawings. Example embodiments, however, may be embodied in various different forms, and should not be construed as being limited only to the illustrated example embodiments. Rather, these example embodiments are provided as examples so that this disclosure will be thorough and complete, and will fully convey the concept of the present invention to those skilled in the art. Accordingly, known processes, elements, and techniques are not described with respect to some of the example embodiments of the present invention. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this present invention belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating an electronic system including two electronic devices which are connected to each other.

Referring to FIG. 1, an electronic system 100 may include a first electronic device 110 and a second electronic device 120. The first electronic device 110 may include a first interface circuit 113 and a first controller 115. The second electronic device 120 may include a second interface circuit 123 and a second controller 125. However, each of the first electronic device 110 and the second electronic device 120 may further include other components not shown in FIG. 1.

In some example embodiments, the first electronic device 110 may be a host and the second electronic device 120 may be a storage device. For instance, when the electronic system 100 is a mobile electronic system, the first electronic device 110 may include an application processor. However, example embodiments are not limited to the above-description. For instance, a function and a configuration of the first electronic device 110 and a function and a configuration of the second electronic device 120 may be exchanged. In addition, the first electronic device 110 and the second electronic device 120 may be other types of electronic devices. For instance, each of the first electronic device 110 and the second electronic device 120 may be a display device, an image processor, or a radio frequency (RF) communication chip. However, the present invention is not limited thereto.

The first electronic device 110 may be connected with the second electronic device 120 through the first interface circuit 113. The first electronic device 110 may exchange signals and data with the second electronic device 120 through the first interface circuit 113. The first interface circuit 113 may include a first physical layer PL1.

The first physical layer PL1 may include physical components for exchanging data with the second electronic device 120. For instance, the first physical layer PL1 may include a transmitting circuit and a receiving circuit for exchanging data with the second electronic device 120. In particular, the transmitting circuit of the first physical layer PL1 may include a plurality of transmitters to increase bandwidth associated with a data transmission.

In some example embodiments, when the electronic system 100 is a mobile electronic system, the first physical layer PL1 may be defined by a "M-PHY" specification. The M-PHY is an interface protocol proposed by the mobile industry processor interface (MIPI) alliance. In this example embodiment, the first interface circuit 113 may further include a link layer (not shown) that manages data composition, integrity, and error. Further, the link layer of the first interface circuit 113 may include a physical adapted layer (not shown). The physical adapted layer may control the first physical layer PL1 (e.g., managing symbols of data, or managing power). The interface circuit 113 operating according to the M-PHY standard may allow the clock signal to be embedded with data through the use of 8b10b encoding, thus allowing the interface circuit 113 to support high-speed data rates from about 1000 Mbit/s up to about 5 Gbit/s.

However, example embodiments are not limited to the above-described example embodiments. As will be described later, example embodiments may be applied to all interface circuits that include a plurality of transmitters, and the above-described example embodiments are provided as an example implementation.

The first controller 115 may manage and control overall operations of the first electronic device 110. In particular, the first controller 115 may process and manage data and signals exchanged through the first interface circuit 113. The first electronic device 110 may perform its own function according to a control of the first controller 115.

The second electronic device 120 may be connected with the first electronic device 110 through the second interface circuit 123. The second electronic device 120 may exchange data and signals with the first electronic device 110 through the second interface circuit 123. The second interface circuit 123 may include a second physical layer PL2.

The second physical layer PL2 may include physical components for exchanging data with the first electronic device 110. For instance, the second physical layer PL2 may include a transmitting circuit and a receiving circuit for exchanging data with the first electronic device 110. In particular, the transmitting circuit of the second physical layer PL2 may include a plurality of transmitters to increase bandwidth associated with a data transmission.

In some example embodiments, when the electronic system 100 is a mobile electronic system, the second physical layer PL2 may be defined by the M-PHY specification. In this example embodiment, the second interface circuit 123 may further include a link layer (not shown) and a physical adapted layer (not shown).

The second controller 125 may manage and control overall operations of the second electronic device 120. In particular, the second controller 125 may process and manage data exchanged through the second interface circuit 123. The second electronic device 120 may perform its own function according to a control of the second controller 125.

In some example embodiments, when the second electronic device 120 is a storage device including a flash memory, the second controller 125 may operate in compliance with the interface protocol defined in the universal flash storage (UFS) specification. In this example embodiment, when the first electronic device 110 is a host, the first controller 115 may operate in compliance with the interface protocol defined in the UFS host controller interface (UFSHCI) specification. However, example embodiments are not limited thereto. As another example embodiment, when the second electronic device 120 is an image sensor, the second controller 125 may operate in compliance with the interface protocol called as the camera serial interface (CSI). Example embodiments may be applied to all interface circuits including a plurality of transmitters, and changes or modifications on example embodiments may be variously made according to an interfacing method.

The interface circuits 113, 123 may include a processor and a memory (not shown), the memory may contain computer readable instructions, that when executed by the processor configure the interface circuits 113, 123 as special purpose computers that provide a same symbol clock signal to each of a plurality of transmitters associated with the interface circuits 113, 123. The processor may be configured to generate parallel data based on received original data using the symbol clock signal, such that each of the transmitters generates the parallel data at a same time irrespective of a time when each of the plurality of transmitters begins to operate. Therefore, the interface circuits 113, 123 may improve the functioning of the computer itself by reducing or eliminating timing skews between the plurality of transmitters included in the interface circuits 113, 123.

Figure 2:
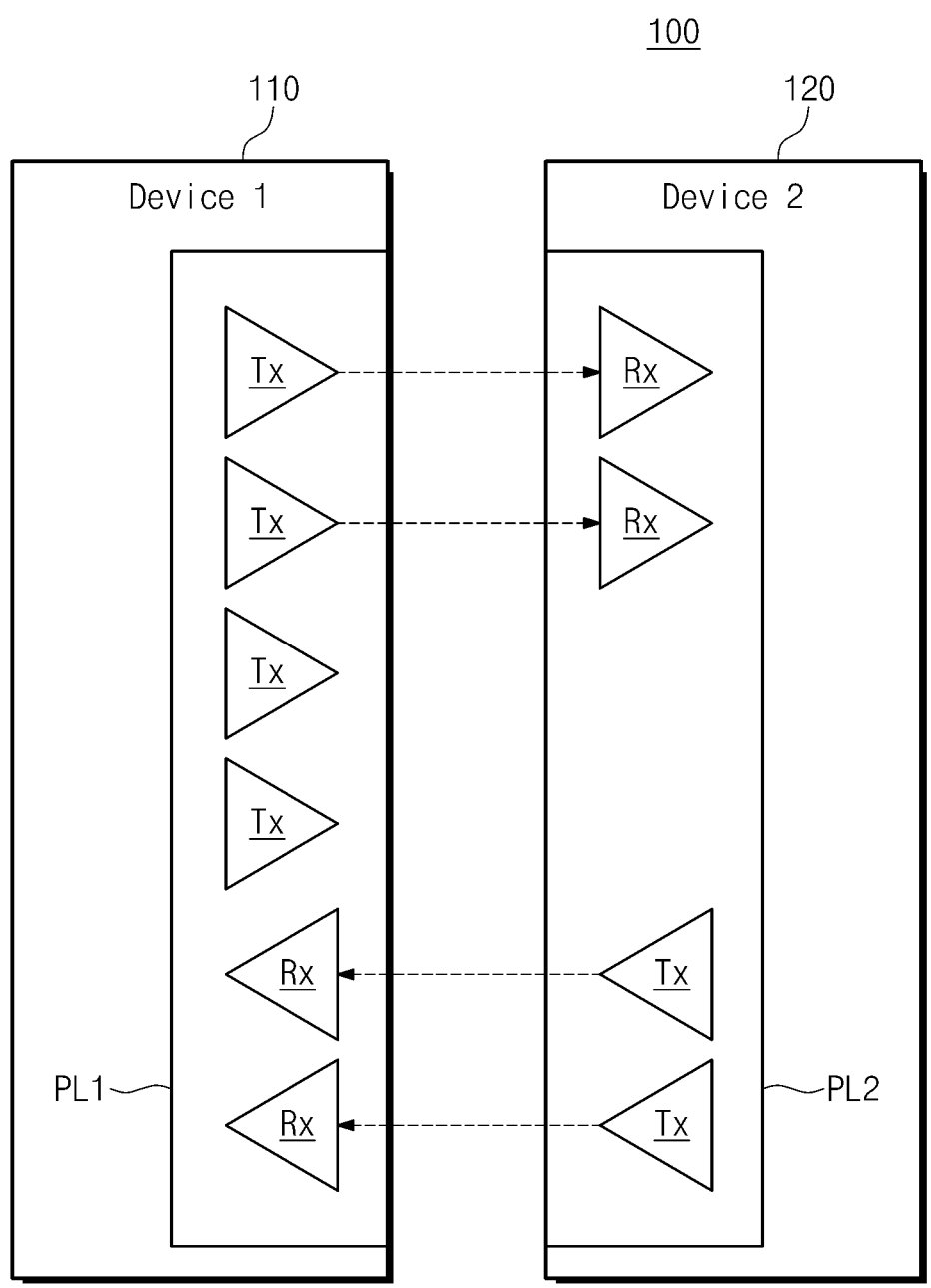
FIG. 2 is a conceptual diagram illustrating a connection between interface circuits of two electronic devices shown in FIG. 1.

FIG. 2 is a conceptual diagram illustrating a connection between interface circuits of two electronic devices shown in FIG. 1.

Referring to FIG. 2, as described with reference to FIG. 1, the electronic system 100 may include the first electronic device 110 and the second electronic device 120 which are connected to each other.

The first electronic device 110 may be connected with the second electronic device 120 through a first physical layer PL1. The second electronic device 120 may be connected with the first electronic device 110 through a second physical layer PL2. Each of the first physical layer PL1 and the second physical layer PL2 may include a transmitting circuit and a receiving circuit. The transmitting circuit may include a plurality of transmitters Tx, and the receiving circuit may include one or more receivers Rx.

In the first physical layer PL1, the number of transmitters Tx and the number of receivers Rx may be variously changed according to a type and/or a kind of the first electronic device 110. In the second physical layer PL2, the number of transmitters Tx and the number of receivers Rx may be variously changed according to a type and/or a kind of the second electronic device 120. When kinds of the first electronic device 110 and the second electronic device 120 are different from each other, the number of transmitters Tx and receivers Rx of the first physical layer PL1 may be different from the number of transmitters Tx and receivers Rx of the second physical layer PL2. Therefore, the configuration illustrated in FIG. 2 is an example configuration, and example embodiments are not limited thereto.

A transmitter Tx and a receiver Rx that are connected to each other may constitute one "lane". A transmitter Tx may send signals and data to a receiver Rx connected thereto. A receiver Rx may receive signals and data from a transmitter Tx connected thereto. However, a transmitter Tx not connected with a receiver Rx and a receiver Rx not connected with a transmitter Tx may not operate or may not be used.

A configuration of a transmitting circuit according to some example embodiments will be described in further detail with reference to FIGS. 3 through 7.

Figure 3:
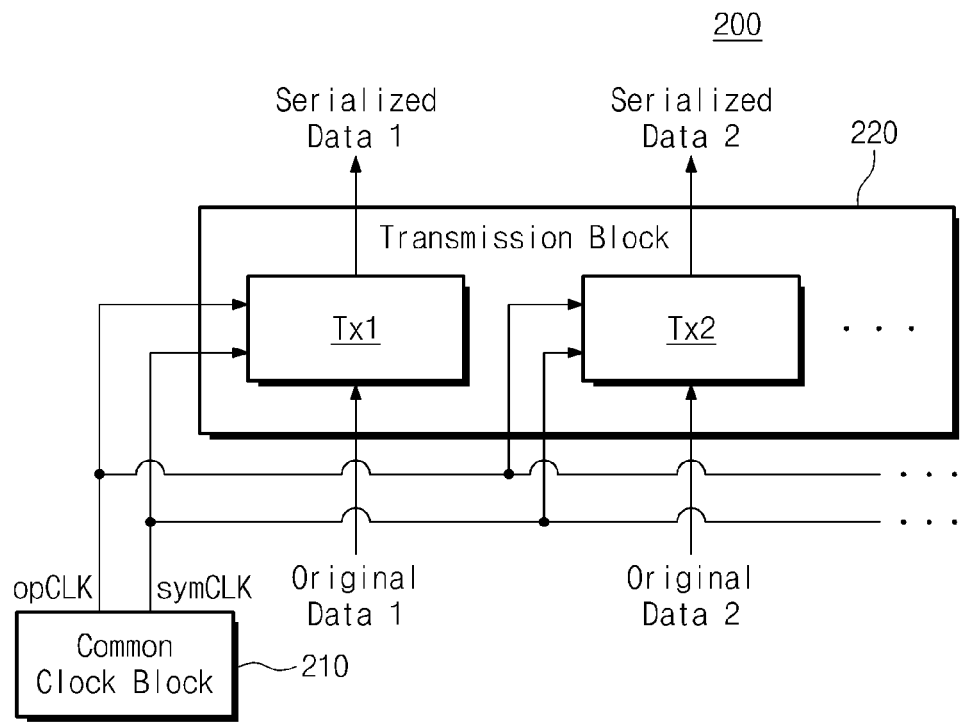
FIG. 3 is a block diagram illustrating a transmitting circuit according to an example embodiment.

FIG. 3 is a block diagram illustrating a transmitting circuit according to some example embodiments.

Referring to FIG. 3, a transmitting circuit 200 may include a common clock block 210 and a transmission block 220.

The common clock block 210 may output an operation clock signal opCLK. The operation clock signal opCLK may be used to serialize parallel data. The common clock block 210 may output a symbol clock signal symCLK. The symbol clock signal symCLK may be used to extract data in symbol units. The symbol clock signal symCLK may be generated by dividing the operation clock signal opCLK.

The transmission block 220 may include a plurality of the transmitters Tx. For example, in FIG. 3, the transmission block 220 includes two transmitters Tx1 and Tx2. However, example embodiments are not limited thereto. For example, the number of transmitters included in the transmission block 220 may be changed as necessary.

The transmitters Tx1 and Tx2 may receive the operation clock signal opCLK from the common clock block 210 in common. Further, the transmitters Tx1 and Tx2 may receive the symbol clock signal symCLK from the common clock block 210 in common. Each of the transmitters Tx1 and Tx2 may operate based on the operation clock signal opCLK and the symbol clock signal symCLK.

A symbol unit may be a unit of data for forming meaningful and/or usable data. A length (e.g., the number of bits) of the symbol unit may be varied as necessary. For instance, when an 8b/10b encoding is used to form meaningful and/or usable data, each of the transmitters Tx1 and Tx2 may process and manage 10-bit data. In this instance, data of the symbol unit may have a length of 10 bits. Further, the symbol clock signal symCLK may be divided to have a period which is ten times a period of the operation clock signal opCLK. However, example embodiments are not limited thereto. In some example embodiments, when data of the symbol unit has a length of N bits, a period of the symbol clock signal symCLK may be N times a period of the operation clock signal opCLK (N being a positive integer).

Each of the transmitters Tx1 and Tx2 may receive original data. For instance, the first transmitter Tx1 may receive first original data, and the second transmitter Tx2 may receive second original data. Each of the transmitters Tx1 and Tx2 may extract data in symbol units from the original data, based on the symbol clock signal symCLK. Each of the transmitters Tx1 and Tx2 may generate parallel data, based on the extracted data in the symbol unit.

Each of the transmitters Tx1 and Tx2 may serialize the parallel data, based on the operation clock signal opCLK. Each of the transmitters Tx1 and Tx2 may output the serialized data. For instance, the first transmitter Tx1 may output first serialized data, and the second transmitter Tx2 may output second serialized data. Configurations and operations of the transmitters Tx1 and Tx2 will be more described below with reference to FIGS. 4 through 7.

In some example embodiments, each of the transmitters Tx1 and Tx2 may receive a common clock signal. For example, the transmitters Tx1 and Tx2 may receive the symbol clock signal symCLK as well as the operation clock signal opCLK, in common. Accordingly, a clock signal provided to the first transmitter Tx1 may be equally synchronized with a clock signal provided to the second transmitter Tx2. That is, clock signals provided to the transmitters Tx1 and Tx2 may be equally synchronized with one another. As described in more detail with reference to FIGS. 8 and 9, due to the synchronization between the transmitters Tx1 and Tx2, timing of the data transmission may not be skewed between lanes respectively corresponding to the transmitters Tx1 and Tx2.

In some example embodiments, when the transmitting circuit 200 is implemented in a mobile electronic system, the transmission block 220 may be included in a physical layer that is defined based on the M-PHY specification proposed by the MIPI alliance. However, example embodiments are not limited thereto. For example, in some example embodiments, the transmission block 220 may be included in a physical layer that is defined based on the peripheral component interconnect express (PCIe) interface protocol. Likewise, example embodiments may be applied to all interface circuits including a plurality of transmitters.

The transmitters Tx1 and Tx2 may operate independently using operation power. For instance, the first transmitter Tx1 may operate regardless of whether the second transmitter Tx2 operates or does not operate. An operation of one transmitter may not affect operations of other transmitters. Independent operations of the transmitters Tx1 and Tx2 will be more described with reference to FIGS. 4 through 6. Due to the use of multiple transmitters, the plurality of transmitters may transmit a large amount of data to a receiving circuit.

Figure 4:
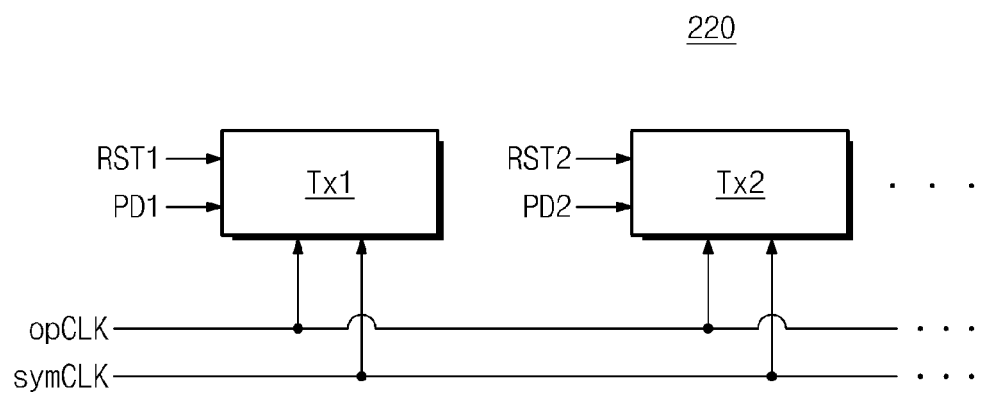
FIG. 4 is a block diagram illustrating a plurality of transmitters according to an example embodiment.

FIG. 4 is a block diagram illustrating a plurality of transmitters according to some example embodiments.

Referring to FIG. 4, as described with reference to FIG. 3, a transmission block 220 may include a plurality of transmitters Tx1 and Tx2. In FIG. 4, it is illustrated that the transmission block 220 includes two transmitters Tx1 and Tx2. However, the illustration of the two transmitters Tx1 and Tx2 is just an example for brevity of the description, and the present invention is not limited thereto. The number of transmitters included in the transmission block 220 may be changed or modified as necessary.

As described above, each of the transmitters Tx1 and Tx2 may operate independently such that an operation of a first one of the transmitters Tx1 and Tx2 may not affect operations of a second one of the transmitters Tx1 and Tx2. For instance, the first transmitter Tx1 may operate regardless of whether the second transmitter Tx2 operates or does not operate.

As an example embodiment, the transmitters Tx1 and Tx2 may receive lane reset signals RST1 and RST2, respectively. For instance, the first transmitter Tx1 may receive the first lane reset signal RST1, and the second transmitter Tx2 may receive the second lane reset signal RST2. The lane reset signals RST1 and RST2 may be independently provided to the transmitters Tx1 and Tx2, respectively.

The first lane reset signal RST1 may be used to reset a state of a lane corresponding to the first transmitter Tx1. The second lane reset signal RST1 may be used to reset a state of a lane corresponding to the second transmitter Tx2. That is, the lane reset signals RST1 and RST2 may be used to reset the states of the lanes corresponding to the transmitters Tx1 and Tx2, respectively.

A transmitter which receives a lane reset signal from among the transmitters Tx1 and Tx2 may temporarily stop operating for state initialization. After the state initialization, the transmitter which has received the lane reset signal may begin to operate. For instance, when an error occurs in one of the transmitters Tx1 and Tx2, a state of a lane corresponding to the transmitter where the error occurs may be reset based on a lane reset signal. Thus, it is possible to transmit data appropriately.

In some example embodiments, the transmitters Tx1 and Tx2 may receive power-down signals PD1 and PD2, respectively. For instance, the first transmitter Tx1 may receive the first power-down signal PD1, and the second transmitter Tx2 may receive the second power-down signal PD2. The power-down signals PD1 and PD2 may be independently provided to the transmitters Tx1 and Tx2, respectively.

The first power-down signal PD1 may be used to stop an operation of the first transmitter Tx1, and the second power-down signal PD2 may be used to stop an operation of the second transmitter Tx2. That is, the power-down signals PD1 and PD2 may be used to stop operations of the transmitters Tx1 and Tx2, respectively.

A transmitter which receives a power-down signal from among the transmitters Tx1 and Tx2 may stop operating. For instance, a transmitter which is not connected to a receiving circuit may stop operating based on the power-down signal. For instance, a transmitter which is at an idle state where data is not output may stop operating based on the power-down signal. Thus, it is possible to reduce power consumed by the transmitters Tx1 and Tx2. The transmitter which receives the power-down signal may begin to operate again, after the power-down signal is released.

Each of the transmitters Tx1 and Tx2 may operate independently based on the lane reset signal and the power-down signal. For instance, when the first transmitter Tx1 receives the first lane reset signal RST1, the second transmitter Tx2 may receive the second lane reset signal RST2 or may not receive the second lane reset signal RST2. For instance, when the second transmitter Tx2 receives the second power-down signal PD2, the first transmitter Tx1 may receive the first power-down signal PD1 or may not receive the first power-down signal PD1. Whether one transmitter receives (or does not receive) the lane reset signal or the power-down signal may be independent from whether other transmitters receive (or do not receive) the lane reset signal or the power-down signal. Thus, each of the transmitters Tx1 and Tx2 may operate independently.

A transmitter which does not receive the lane reset signal and the power-down signal from among the transmitters Tx1 and Tx2 may operate. On the other hand, a transmitter which receives at least one of the lane reset signal and the power-down signal from among the transmitters Tx1 and Tx2 may stop operating. A transmitter which receives the lane reset signal may temporarily stop operating to reset a state of a lane, and a transmitter which receives the power-down signal may stop operating to reduce power consumption. As described above, however, each of the transmitters Tx1 and Tx2 may operate independently. For instance, the first transmitter Tx1 may continuously operate even when the second transmitter Tx2 stops operating in response to receiving the second lane reset signal RST2 or the second power-down signal PD2.

In some example embodiments, a transmitter which does not receive a lane reset signal and a power-down signal and continues to operate from among the transmitters Tx1 and Tx2 may receive an operation clock signal opCLK and a symbol clock signal symCLK. On the other hand, a transmitter which receives at least one of a lane reset signal and a power-down signal and stops operating from among the transmitters Tx1 and Tx2 may not receive the operation clock signal opCLK and the symbol clock signal symCLK. This will be more described with reference to FIG. 6.

As each of the transmitters Tx1 and Tx2 operates independently, the time when each of the transmitters begins to operate may be different from one another. For instance, a first time where the first transmitter Tx1 begins to operate may be different from a second time where the second transmitter Tx2 begins to operate.

As described with reference to FIG. 3, however, each of the transmitters Tx1 and Tx2 may receive the operation clock signal opCLK and the symbol clock signal symCLK in common. Accordingly, even though the time when one transmitter begins to operate is different from time when another transmitter begins to operate, the two transmitters may receive the identical symbol clock signal symCLK. For instance, even though the first time where the first transmitter Tx1 begins to operate may be different from the second time where the second transmitter Tx2 begins to operate, the symbol clock signal symCLK provided to the first transmitter Tx1 may be equally synchronized with the symbol clock signal symCLK provided to the second transmitter Tx2. The symbol clock signals symCLK which are equally synchronized will be more described with reference to FIG. 9.

Figure 5:
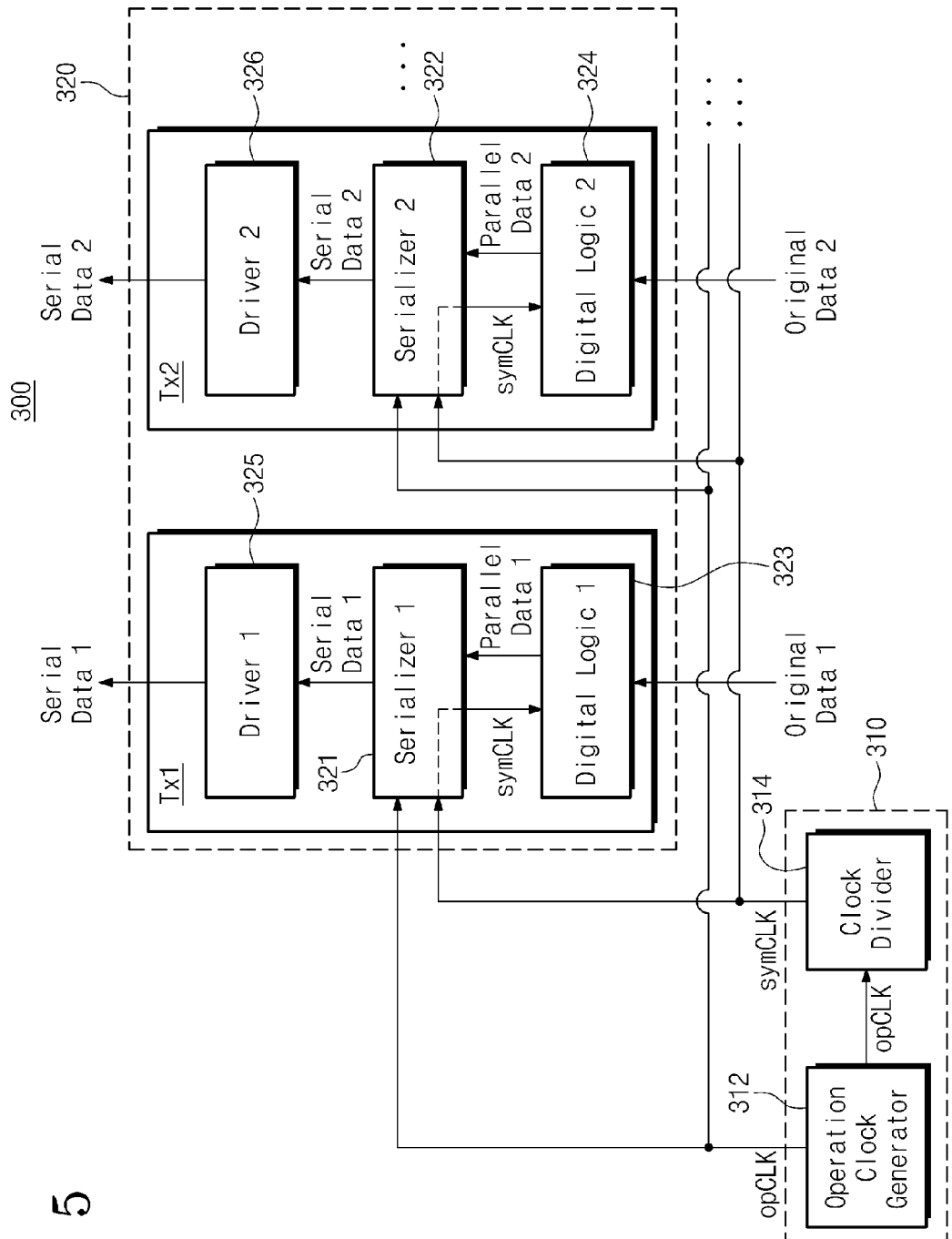
FIG. 5 is a block diagram illustrating a transmitting circuit according to an example embodiment.

FIG. 5 is a block diagram illustrating a transmitting circuit according to some example embodiments.

Referring to FIG. 5, a transmitting circuit 300 may include a common clock block 310 and a transmission block 320. The common clock block 310 and the transmission block 320 may be the common clock block 210 and the transmission block 220 with details on the blocks therein illustrated in more detail.

The common clock block 310 may include an operation clock generator 312 and a clock divider 314. The transmission block 320 may include a plurality of transmitters Tx1 and Tx2. In FIG. 5, the transmission block 320 includes two transmitters Tx1 and Tx2, however, example embodiments are not limited thereto. For example, the number of transmitters included in the transmission block 320 may be changed or varied as necessary.

The operation clock generator 312 may generate the operation clock signal opCLK. The operation clock signal opCLK may be used to serialize parallel data. The operation clock signal opCLK may be provided in common to the transmitters Tx1 and Tx2. In some example embodiments, the operation clock generator 312 may include a phase locked loop (PLL) circuit (not shown), but example embodiments not limited thereto. For example, the operation clock generator 312 may include any component that generates a clock signal having a specific frequency.

The clock divider 314 may receive the operation clock signal opCLK. The clock divider 314 may generate a symbol clock signal symCLK. The symbol clock signal symCLK may be used to extract data in symbol units. The symbol clock signal symCLK may be generated by dividing the operation clock signal opCLK. The symbol clock signal symCLK may be provided in common to the transmitters Tx1 and Tx2.

Each of the transmitters Tx1 and Tx2 may receive original data in parallel, and may output data serially. The transmitters Tx1 and Tx2 may receive the operation clock signal opCLK generated by the operation clock generator 312 in common. Further, the transmitters Tx1 and Tx2 may receive the symbol clock signal symCLK generated by the clock divider 314 in common. Each of the transmitters Tx1 and Tx2 may operate based on the operation clock signal opCLK and the symbol clock signal symCLK.

As described above, the symbol unit may be a unit of data forming meaningful and/or usable data. A length of the symbol unit may be change or vary as necessary. For instance, the symbol unit may have a bit length of data processed by the transmission block 320. As an example embodiment, when data of the symbol unit has a length of N bits, a period of the symbol clock signal symCLK may be N times a period of the operation clock signal opCLK (N being a positive integer).

In some example embodiments, the first transmitter Tx1 may include a first serializer 321, first digital logic 323, and a first driver 325. However, the first transmitter Tx1 may further include other components not shown in FIG. 5.

The first digital logic 323 may receive first original data. The original data may include information to be transmitted from the transmission circuit 300 to a receiving circuit (not shown). The original data may be provided from another component of an electronic device that includes the transmission circuit 300. The first digital logic 323 may extract data of the symbol unit from the first original data based on the symbol clock signal symCLK. As an example embodiment, the first digital logic 323 may receive the symbol clock signal symCLK through the first serializer 321. The first digital logic 323 may generate first parallel data, based on the extracted data of the symbol unit. The first digital logic 323 may provide the first parallel data to the first serializer 321.

The first serializer 321 may receive the first parallel data, the operation clock signal opCLK and the symbol clock signal symCLK. For example, the first serializer 321 may receive the first parallel data from the first digital logic 323 in synchronization with the symbol clock signal symCLK from the clock divider 310. Further, the first serializer 321 may serialize the first parallel data in synchronization with the operation clock signal opCLK to generate first serial data. The first serializer 321 may provide the first serial data to the first driver 325.

The first driver 325 may receive the first serial data from the first serializer 321. The first driver 325 may output the first serial data. The first serial data output from the first driver 325 may be transmitted to a receiving circuit which is connected to the transmission circuit 300.

In some example embodiments, the second transmitter Tx2 may include a second serializer 322, second digital logic 324, and a second driver 326. The second serializer 322, the second digital logic 324, and the second driver 326 may be configured similarly to the first serializer 321, the first digital logic 323, and the first driver 325 respectively, and may operate substantially the same as the first serializer 321, the first digital logic 323, and the first driver 325 respectively. When the transmission block 320 includes three or more transmitters, transmitters of the transmission block 320 other than the first transmitter Tx1 and the second transmitter Tx2 may operate substantially the same as the first transmitter Tx1 (or the second transmitter Tx2). Therefore, redundant descriptions will be omitted for brevity of the description.

As discussed above, the plurality of transmitters may receive clock signal in common. For example, the plurality of transmitters may receive the symbol clock signal symCLK as well as the operation clock signal opCLK in common. Thus, for instance, a clock signal provided to the first transmitter Tx1 may be equally synchronized with a clock signal provided to the second transmitter Tx2. In some example embodiments, all clock signals provided to the plurality of transmitters may be equally synchronized with one another. As described in more detail with reference to FIGS. 8 and 9, due to the synchronization between the transmitters Tx1 and Tx2, timing of the data transmission may not be skewed between lanes respectively corresponding to the transmitters Tx1 and Tx2.

In some example embodiments, when the transmitting circuit 300 is implemented in a mobile electronic system, the transmission block 320 may be included in a physical layer that is defined based on the M-PHY specification proposed by the MIPI alliance. However, example embodiments are not limited to thereto. For example, the transmission block 220 may include a physical layer that is defined based on the PCIe interface protocol. Likewise, example embodiments may be applied to all interface circuits including a plurality of transmitters.

Each of the plurality of transmitters may operate independently using operation power. For instance, the first transmitter Tx1 may operate regardless of whether the second transmitter Tx2 operates or does not operate. An operation of one transmitter may not affect operations of other transmitters. Independent operations of the plurality of transmitters will be more described with reference to FIG. 6.

Figure 6:
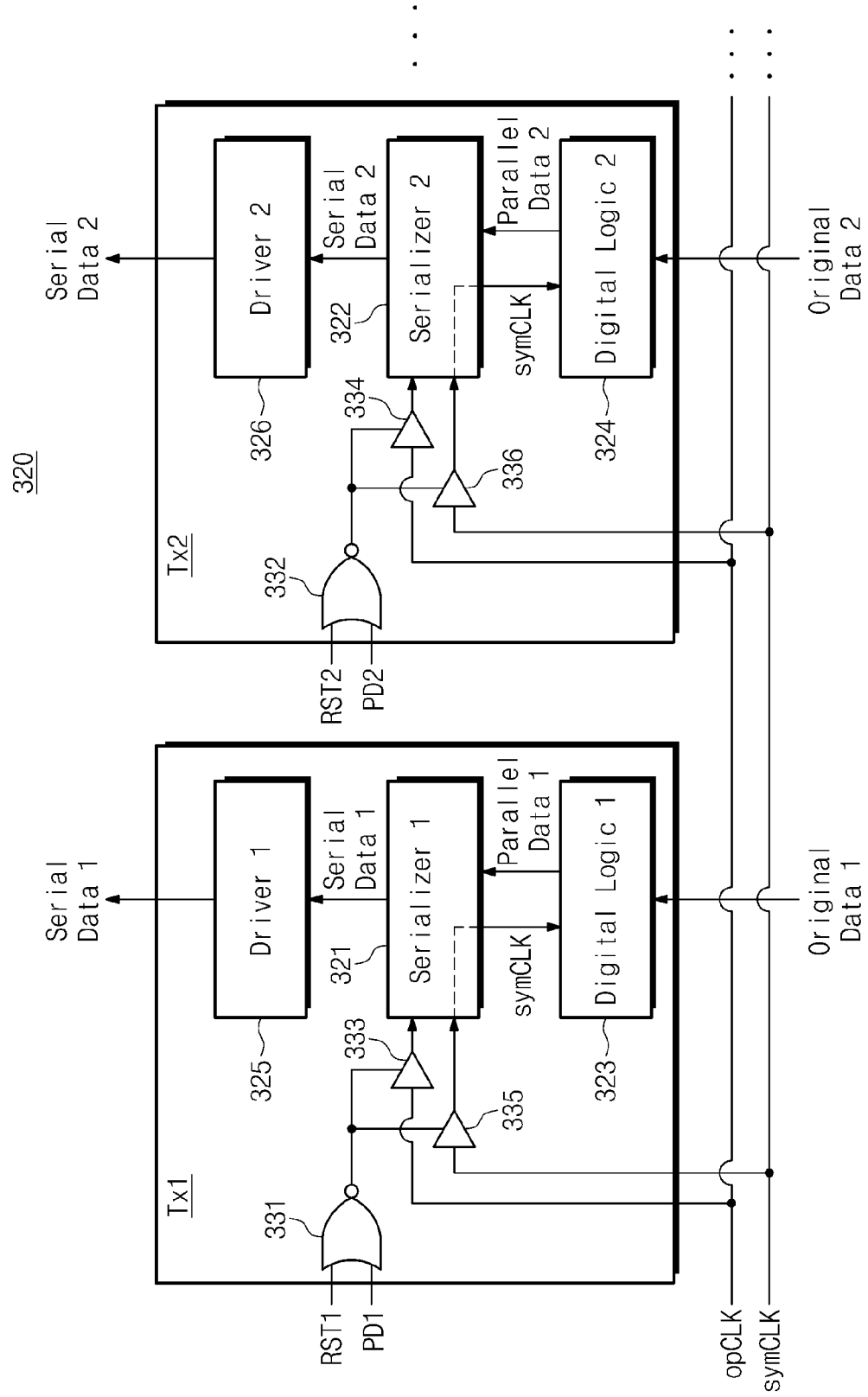
FIG. 6 is a conceptual diagram illustrating a plurality of transmitters according to an example embodiment.

FIG. 6 is a conceptual diagram illustrating a plurality of transmitters according to some example embodiments.

Referring to FIG. 6, as described with reference to FIG. 5, a transmission block 320 may include a plurality of transmitters Tx1 and Tx2. In FIG. 6, the transmission block 320 includes two transmitters Tx1 and Tx2. However, example embodiments are not limited thereto. For example, the number of transmitters included in the transmission block 320 may be modified or varied as necessary.

Configurations and functions of the first serializer 321, first digital logic 323, and first driver 325 have been described with reference to FIG. 5, thus redundant descriptions will be omitted herein. Further, redundant descriptions associated with configurations and functions of the second serializer 322, second digital logic 324, and second driver 326 will be also omitted herein.

As described above, the transmitters Tx1 and Tx2 may operate independently. For instance, the first transmitter Tx1 may operate independently regardless of whether the second transmitter Tx2 operates or does not operate. An operation of one transmitter may not affect an operation of another transmitter.

As described above, the lane reset signals RST1 and RST2 may be respectively provided to the transmitters Tx1 and Tx2. For instance, the first lane reset signal RST1 may be provided to the first transmitter Tx1, and the second lane reset signal RST2 may be provided to the second transmitter Tx2. That is, the lane reset signals RST1 and RST2 may be independently provided to the transmitters Tx1 and Tx2, respectively.

In some example embodiments, a controller or a processor (not shown) may generate the lane reset signal RST1 and RST2. For instance, the controller or the processor may be a separate circuit from the transmitting circuit 300, or may be included in the transmitting circuit 300. In other example embodiments, the lane reset signal RST1 and RST2 may be generated by another electronic device or system which is connected with an electronic device or system including the transmitting circuit 300. In still other example embodiments, the lane reset signal RST1 and RST2 may be provided from a user of an electronic device or system including the transmitting circuit 300. However, example embodiments are not limited thereto.

The first lane reset signal RST1 may be used to reset a state of a lane corresponding to the first transmitter Tx1. The second lane reset signal RST1 may be used to reset a state of a lane corresponding to the second transmitter Tx2. That is, the lane reset signals RST1 and RST2 may be used to reset the states of the lanes corresponding to the transmitters Tx1 and Tx2 respectively.

A transmitter which receives a lane reset signal from among the plurality of transmitters may temporarily stop operating for state initialization. After the state initialization, the transmitter which has received the lane reset signal may begin to operate. When an error occurs in a transmitter, a state of a lane corresponding to the transmitter where the error occurs may be reset based on a lane reset signal. Thus, it is possible to transmit data appropriately.

As described above, the transmitters Tx1 and Tx2 may receive power-down signals PD1 and PD2, respectively. For instance, the first transmitter Tx1 may receive the first power-down signal PD1, and the second transmitter Tx2 may receive the second power-down signal PD2. That is, the power-down signals PD1 and PD2 may be independently provided to the transmitters Tx1 and Tx2, respectively.

In some example embodiments, a controller or a processor (not shown) may generate the power-down signals PD1 and PD2. For instance, the controller or the processor may be a separate circuit from the transmitting circuit 300, or may be included in the transmitting circuit 300. As another example embodiment, the power-down signals PD1 and PD2 may be provided from another electronic device or system which is connected to an electronic device or system including the transmitting circuit 300. As still another example embodiment, the power-down signals PD1 and PD2 may be provided from a user of an electronic device or system including the transmitting circuit 300. However, example embodiments are not limited thereto.

The first power-down signal PD1 may be used to stop an operation of the first transmitter Tx1, and the second power-down signal PD2 may be used to stop an operation of the second transmitter Tx2. That is, the power-down signals PD1 and PD2 may be used to stop operations of the transmitters Tx1 and Tx2, respectively.

A transmitter which receives a power-down signal from among the plurality of transmitters may stop operating. The transmitter which has received the power-down signal may begin to operate again, after the power-down signal is released. As an example embodiment, a transmitter which is not connected to a receiving circuit from among the plurality of transmitters may stop operating based on the power-down signal. As an example embodiment, a transmitter which is at an idle state where data is not output from among the plurality of transmitters may stop operating based on the power-down signal. Thus, it is possible to minimize power consumed by the plurality of transmitters.

The plurality of transmitters may operate independently based on the lane reset signal and the power-down signal. For instance, when the first transmitter Tx1 receives the first lane reset signal RST1, the second transmitter Tx2 may receive the second lane reset signal RST2 or may not receive the second lane reset signal RST2. For instance, when the second transmitter Tx2 receives the second power-down signal PD2, the first transmitter Tx1 may receive the first power-down signal PD1 or may not receive the first power-down signal PD1. Whether one of the plurality of transmitters receives (or does not receive) the lane reset signal or the power-down signal may be independent from whether other transmitters receive (or do not receive) the lane reset signal or the power-down signal. Thus, the plurality of transmitters may operate independently.

In some example embodiments, the first transmitter Tx1 may include first signal providing logic 331. In some example embodiments, the first signal providing logic 331 may include a NOR gate. The first lane reset signal RST1 and the first power-down signal PD1 may be provided as inputs to the first signal providing logic 331.

In some example embodiments, when a logical value corresponding to the first lane reset signal RST1 and a logical value corresponding to the first power-down signal PD1 correspond to logic "0", the NOR gate of the first signal providing logic 331 may output logic "1". On the other hand, when at least one of the logical value corresponding to the first lane reset signal RST1 and the logical value corresponding to the first power-down signal PD1 correspond to logic "1", the NOR gate of the first signal providing logic 331 may output logic "0". However, the first signal providing logic 331 may be configured differently from the illustration of FIG. 6, and example embodiments are not limited this illustration.

In some example embodiments, the first transmitter Tx1 may include a first operation clock buffer 333. The first operation clock buffer 333 may selectively transmit the operation clock signal opCLK to the first serializer 321 according to an output of the first signal providing logic 331. For instance, when the output of the first signal providing logic 331 corresponds to logic "1", the first operation clock buffer 333 may operate and the operation clock signal opCLK may be transmitted to the first serializer 321. Further, when the output of the first signal providing logic 331 corresponds to logic "0", the first operation clock buffer 333 does not operate and the operation clock signal opCLK may not be transmitted to the first serializer 321.

That is, the first operation clock buffer 333 may operate or not operate according to whether the first lane reset signal RST1 and the first power-down signal PD1 are provided. When the first lane reset signal RST1 and the first power-down signal PD1 are not provided, the first operation clock buffer 333 may transmit the operation clock signal opCLK to the first serializer 321. When at least one of the first lane reset signal RST1 and the first power-down signal PD1 is provided, the first operation clock buffer 333 may not transmit the operation clock signal opCLK to the first serializer 321.

In some example embodiments, the first transmitter Tx1 may also include a first symbol clock buffer 335. The first symbol clock buffer 335 may selectively transmit the symbol clock signal symCLK to the first serializer 321 according to the output of the first signal providing logic 331. For instance, when the output of the first signal providing logic 331 corresponds to logic "1", the first symbol clock buffer 335 may operate and the symbol clock signal symCLK may be transmitted to the first serializer 321. For instance, when the output of the first signal providing logic 331 corresponds to logic "0", the first symbol clock buffer 335 may not operate and the symbol clock signal symCLK may not be transmitted to the first serializer 321.

That is, the first symbol clock buffer 335 may operate or not operate according to whether the first lane reset signal RST1 and the first power-down signal PD1 are provided. When the first lane reset signal RST1 and the first power-down signal PD1 are not provided, the first symbol clock buffer 335 may transmit the symbol clock signal symCLK to the first serializer 321. When at least one of the first lane reset signal RST1 and the first power-down signal PD1 is provided, the first symbol clock buffer 335 may not transmit the symbol clock signal symCLK to the first serializer 321.

In some example embodiments, the second transmitter Tx2 may include a second signal providing logic 332, a second operation clock buffer 334, and a second symbol clock buffer 336. The second signal providing logic 332, the second operation clock buffer 334, and the second symbol clock buffer 336 may be configured similarly to the first signal providing logic 331, the first operation clock buffer 333, and the first symbol clock buffer 335 respectively, and may operate substantially the same as the first signal providing logic 331, the first operation clock buffer 333, and the first symbol clock buffer 335 respectively, and, therefore redundant descriptions will be omitted herein.

As described above, each of the plurality of transmitters may operate independently. In some example embodiments, a transmitter which does not receive a lane reset signal and a power-down signal from among the plurality of transmitters may receive the operation clock signal opCLK and the symbol clock signal symCLK and may continue to operate. On the other hand, a transmitter which receives at least one of a lane reset signal and a power-down signal from among the plurality of transmitters may not receive the operation clock signal opCLK and the symbol clock signal symCLK and may stop operating.

As each of the plurality of transmitters operates independently, each of the plurality of transmitters may begin to operate at different times. As described with reference to FIG. 5, however, the plurality of transmitters may receive the operation clock signal opCLK and the symbol clock signal symCLK in common.

Thus, even though the time when one transmitter begins to operate may be different from time when another transmitter begins to operate, the two transmitters may receive the identical symbol clock signal symCLK. For instance, even when first time where the first transmitter Tx1 begins to operate is different from second time where the second transmitter Tx2 begins to operate, the symbol clock signal symCLK provided to the first transmitter Tx1 may be equally synchronized with the symbol clock signal symCLK provided to the second transmitter Tx2. The symbol clock signals symCLK which are equally synchronized will be more described with reference to FIG. 9.

Figure 7:
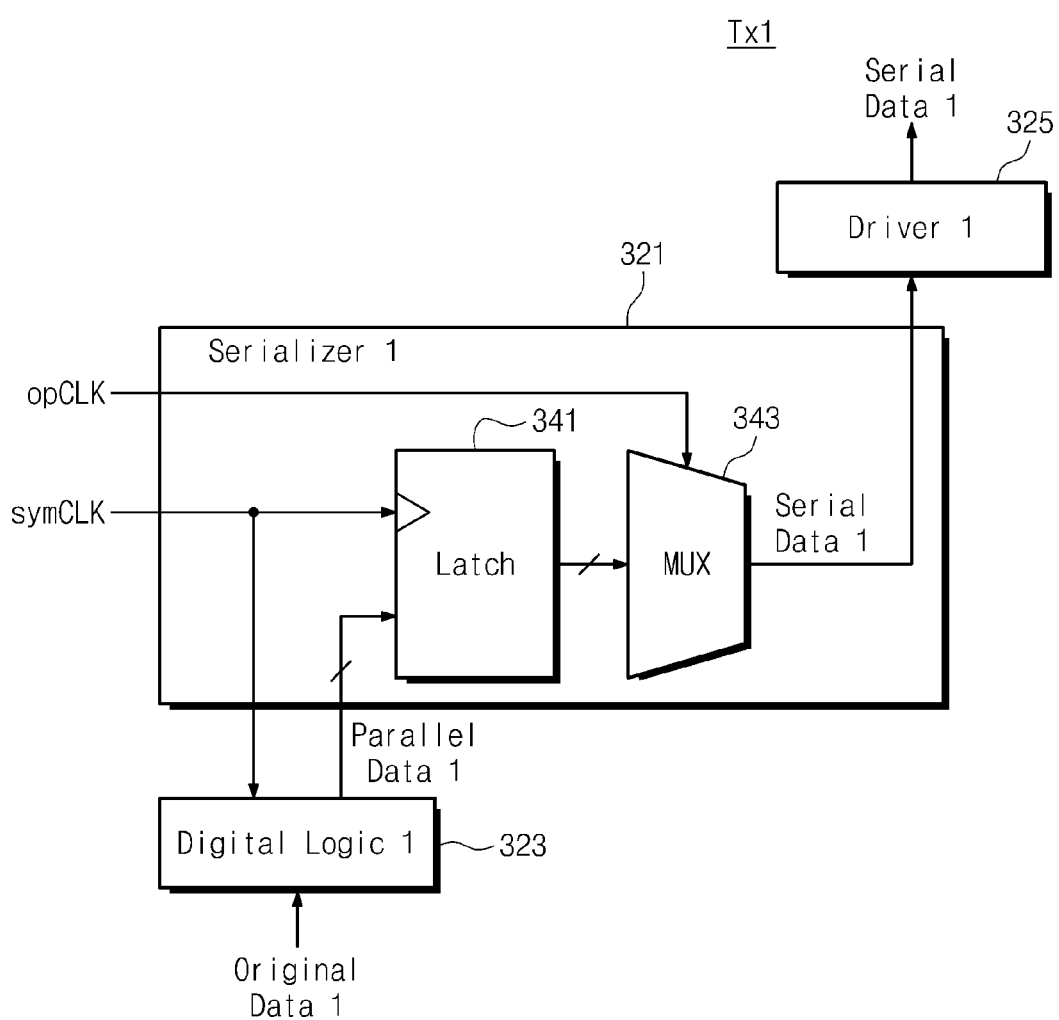
FIG. 7 is a block diagram illustrating a transmitter according to an example embodiment.

FIG. 7 is a block diagram illustrating a transmitter according to some example embodiments.

Referring to FIG. 7, the first transmitter Tx1 may include the first serializer 321, first digital logic 323, and first driver 325. Configurations and functions of the first serializer 321, the first digital logic 323, and the first driver 325 have been described with reference to FIG. 5, thus, redundant descriptions will be omitted herein for brevity of the description.

In some example embodiments, the first serializer 321 may include a latch 341 and a multiplexer 343. In some example embodiments, the first serializer 321 may provide the received operation clock signal opCLK to the multiplexer 343. Further, the first serializer 321 may provide the received symbol clock signal symCLK to the latch 341. In some example embodiments, the symbol clock signal symCLK may also be provided to the first digital logic 323. For example, the first serializer 321 may provide the symbol clock signal symCLK to the first digital logic 323 or the first symbol clock buffer 335 may provide the symbol clock signal symCLK directly to the first digital logic 323.

The first digital logic 323 may extract data in units of the symbol unit from first original data based on the symbol clock signal symCLK to output the first parallel data, and provide the first parallel data to the latch 341. The first digital logic 323 may provide the first parallel data to the latch 341 based on the symbol clock signal symCLK such that the latch 341 synchronously receives the first parallel data and symbol clock signal symCLK.

The multiplexer 343 may receive the first parallel data from the latch 341. The multiplexer 343 may serialize the first parallel data to generate the first serial data. The multiplexer 343 may serialize the first parallel data in synchronization with the operation clock signal opCLK. The multiplexer 343 may provide the first serial data to the first driver 325.

However, a configuration of the first serializer 321 is not limited to the illustration of FIG. 7. For example, the configuration of the first serializer 321 may be any configuration which serializes parallel data. Further, the first serializer 321 may further include other components not shown in FIG. 7.

The second transmitter Tx2 may be configured to be similar to the first transmitter Tx1, and may operate in the same manner as the first transmitter Tx1. When the transmission block 320 includes three or more transmitters, transmitters of the transmission block 320 other than the first transmitter Tx1 and the second transmitter Tx2 may operate substantially the same as the first transmitter Tx1 (or the second transmitter Tx2), thus, redundant descriptions will be omitted herein.

Figure 8:
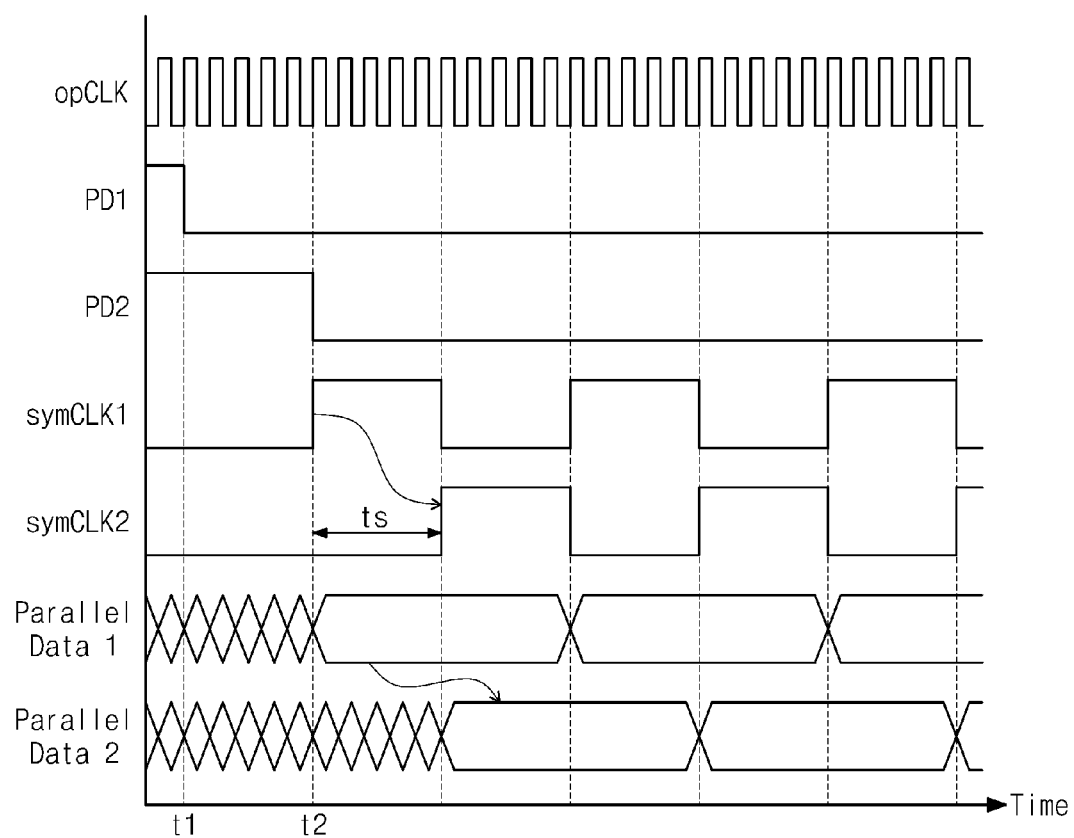
FIG. 8 is a timing diagram showing a case where timing of a data transmission is skewed between lanes respectively corresponding to a plurality of transmitters.

FIG. 8 is a timing diagram showing a case where timing of a data transmission is skewed between lanes respectively corresponding to a plurality of transmitters.

Referring to FIGS. 3, 5, 6 and 8, when a transmitting circuit does not include the common clock block 210 (refer to FIG. 3) or the common clock block 310 (refer to FIG. 5), each of the transmitters may utilize different symbol clocks symCLK. By using different symbol clocks SYMCLK, the transmitters of the transmitting circuit may become unsynchronized. Therefore, the transmitting circuit may transmit data such that a timing of a data transmission is skewed between lanes respectively corresponding to the transmitters.

For example, a first transmitter Tx1 and a second transmitter Tx2 may generate a first symbol clock signal symCLK1 and a second symbol clock signal symCLK2, respectively, by dividing an operation clock signal opCLK. First parallel data may be generated based on the first symbol clock signal symCLK1, and second parallel data may be generated based on the second symbol clock signal symCLK2. In FIG. 8, it is illustrated that a period of each of the first symbol clock signal symCLK1 and the second symbol clock signal symCLK2 is ten times a period of the operation clock signal opCLK. However, example embodiments are not limited thereto. For instance, when the data of the symbol unit has a length of N bits, a period of each of the first symbol clock signal symCLK1 and the second symbol clock signal symCLK2 may be N times a period of the operation clock signal opCLK (N being a positive integer).

As described above, each of a plurality of transmitters Tx1 and Tx2 included in the transmitting circuit 200 or 300 may operate independently. For instance, a first time where the first transmitter Tx1 begins to operate may be different from a second time where the second transmitter Tx2 begins to operate. An operation of one transmitter may not affect operations of other transmitters.

For instance, the first transmitter Tx1 may not receive a first power-down signal PD1 after time 't1'. The first transmitter Tx1 may begin to operate after time 't1'. For instance, the second transmitter Tx2 may not receive a second power-down signal PD2 after time 't2'. The second transmitter Tx2 may begin to operate after time 't2'.

As discussed above with reference to FIG. 6, the first transmitter Tx1 and the second transmitter Tx2 may begin to receive the operation clock op CLK and the symbol clock symCLK based on the lane RST signal and the power down PD signal, for example, when the lane reset RST and the power down PD signals have a logic level low. However, when the common clock block 210 or 310 is not used, since the first power down signal PD1 is received before the second power down signal PD2, the first transmitter Tx1 may begin to receive the first symbol clock signal symCLK1 at the first time (e.g., time 't1') while the second transmitter Tx2 may begin to receive the second symbol block signal symCLK2 at the second time (e.g., time 't2'). In this case, the first symbol clock signal symCLK1 may not be equally synchronized with the second symbol clock signal symCLK2.

For instance, in FIG. 8, a time difference as much as 'ts' may occur between the first symbol clock signal symCLK1 and the second symbol clock signal symCLK2. As a result, delay as much as 'ts' may occur between first time when the first parallel data is generated and transmitted and second time when the second parallel data is generated and transmitted.

That is, when the first symbol clock signal symCLK1 is not equally synchronized with the second symbol clock signal symCLK2, time when the first parallel data is generated and transmitted may be different from time when the second parallel data is generated and transmitted. Thus, timing skew may occur between a first lane corresponding to the first transmitter Tx1 and a second lane corresponding to the second transmitter Tx2 upon transmitting of data, thereby causing an error upon the transmitting of data.

Figure 9:
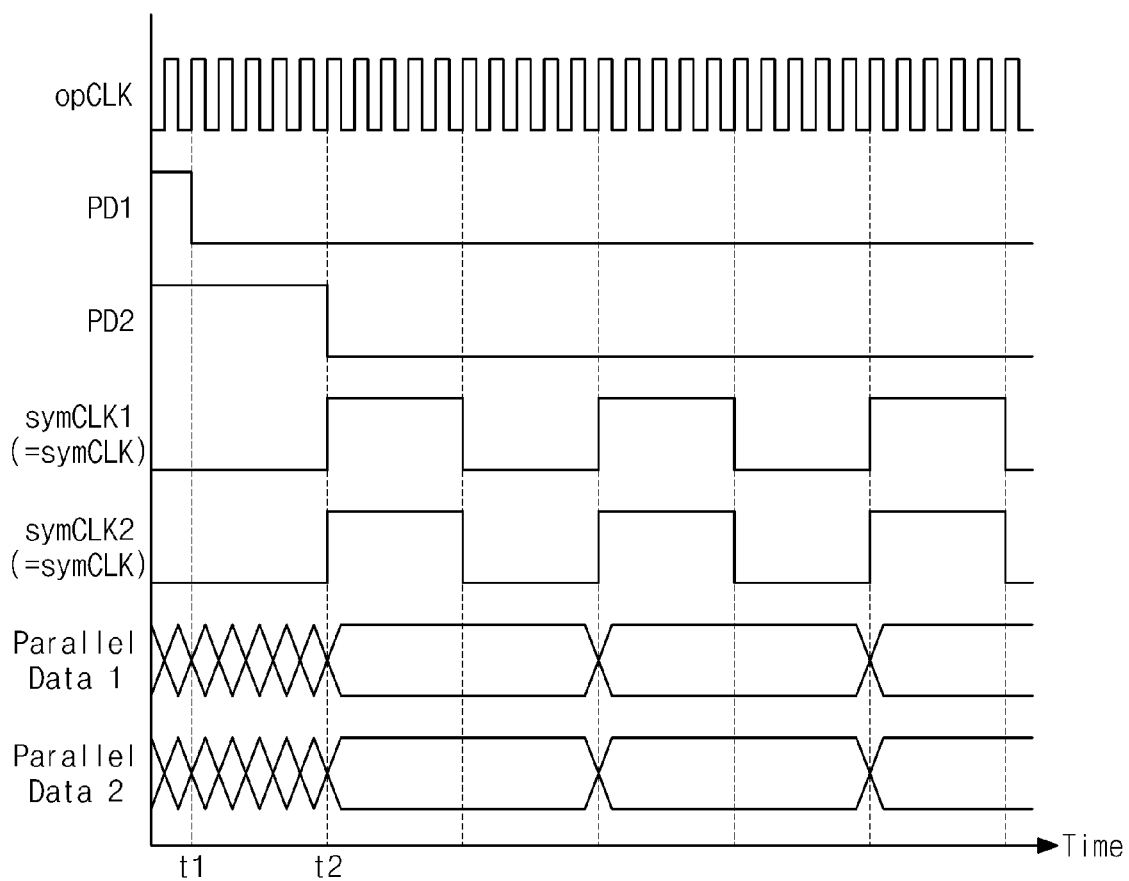
FIG. 9 is a timing diagram showing an effect obtained by an example embodiment.

FIG. 9 is a timing diagram showing an effect obtained by a transmitting circuit according some example embodiments.

Referring to FIGS. 3, 5, 6, 8 and 9, unlike FIG. 8, FIG. 9 shows a case where the transmitting circuit 200, 300 includes the common clock block 210 (refer to FIG. 3) or the common clock block 310 (refer to FIG. 5) according to some example embodiment.

Like the example in FIG. 8, in the example illustrated in FIG. 9, the first power-down signal PD1 may switch to logic levels at time 't1' and the second power-down signal PD2 may switch logic levels at time 't2' and, therefore, the first transmitter Tx1 may begin to operate after time 't1' and the second transmitter Tx2 may begin to operate after time 't2'.

However, when the transmitting circuit 200, 300 includes the common clock block 210 or 310 according to some example embodiments, the transmitters Tx1 and Tx2 receive a common symbol clock signal symCLK generated by the common clock block 210 or 310, and utilize the common symbol clock signal symCLK as the first symbol clock signal symCLK1 and the second symbol clock signal symCLK2, respectively. Therefore, the first symbol clock signal symCLK1 may be equally synchronized with the second symbol clock signal symCLK2, even though first time where the first transmitter Tx1 begins to receive the first symbol clock signal symCLK1 may be different second time where the second transmitter Tx2 begins to receive the second symbol clock signal symCLK2.

Consequently, the first time when first parallel data is generated and transmitted may be equal to the second time when second parallel data is generated and transmitted. Accordingly, the time when the first serial data is generated and output may be equal to the time when the second serial data is generated and output. Thus, the transmitting circuit 200, 300 may reduce or eliminate a timing skew between a first lane corresponding to the first transmitter Tx1 and a second lane corresponding to the second transmitter Tx2 upon transmitting of data, and, therefore, timing of data transmission may not be skewed between the first lane and the second lane. Thus, an error associated with the data transmission may not occur, and data may be stably transmitted through the plurality of transmitters.

In FIGS. 8 and 9, it is assumed that the first transmitter Tx1 and the second transmitter Tx2 operate when each of the first power-down signal PD1 and the second power-down signal PD2 has a value corresponding to logic "0". However, logical values of the first power-down signal PD1 and the second power-down signal PD2 for respectively operating the first transmitter Tx1 and the second transmitter Tx2 may be changed or modified as necessary.

Described with reference FIGS. 8 and 9 is a case where the first transmitter Tx1 operates based on the first power-down signal PD1 and the second transmitter Tx2 operates based on the second power-down signal PD2. However, the descriptions with reference to FIGS. 8 and 9 may be similarly applied to a case where the first transmitter Tx1 operates based on the first lane reset signal RST1 (refer to FIG. 5) and the second transmitter Tx2 operates based on the second lane reset signal RST2 (refer to FIG. 5), or to a case where the first transmitter Tx1 operates based on the first lane reset signal RST1 and the second transmitter Tx2 operates based on the second power-down signal PD2.

In the descriptions with reference to FIGS. 8 and 9, two transmitters included in the plurality of transmitters have been mentioned. As described above, however, the number of transmitters included in the plurality of transmitters may be changed, modified or varied as necessary. When the plurality of transmitters includes three or more transmitters, the descriptions with reference to FIGS. 8 and 9 may be similarly applied with respect to each of the three or more transmitters.

Figure 10:
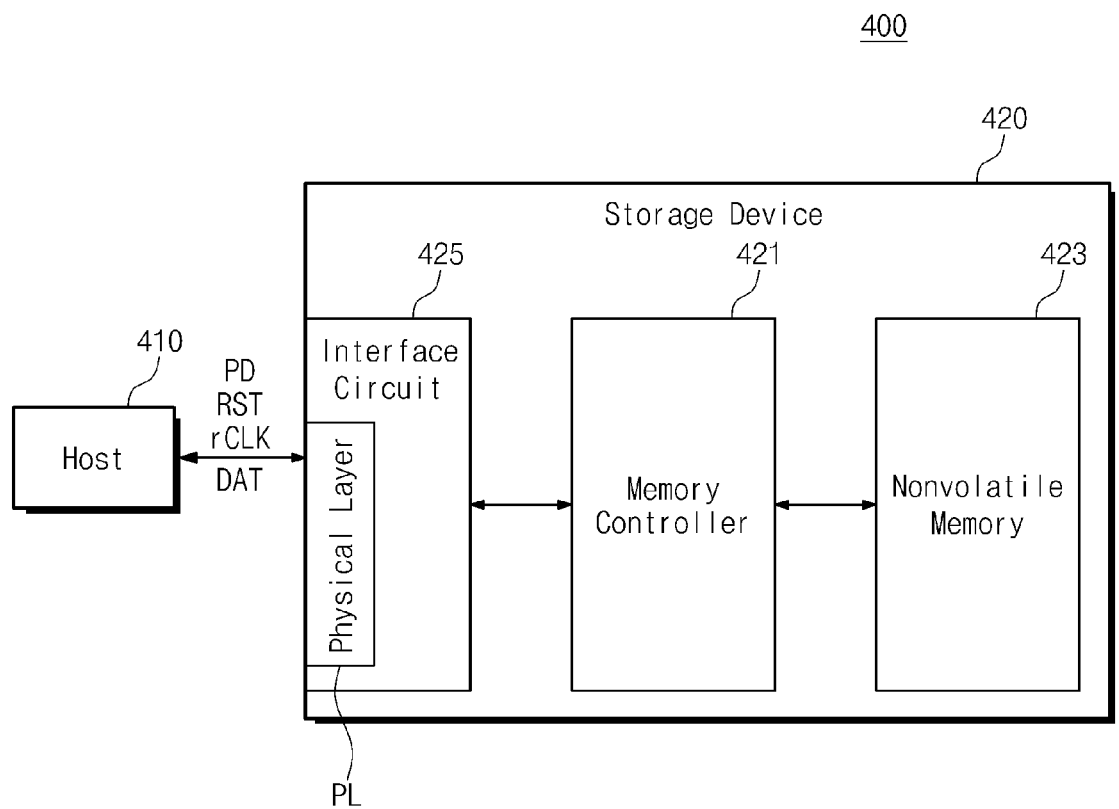
FIG. 10 is a block diagram illustrating a storage system according to an example embodiment.

FIG. 10 is a block diagram illustrating a storage system according to some example embodiments.

Referring to FIG. 10, a storage system 400 may include a host 410 and a storage device 420.

For instance, the host 410 may be the first electronic device 110 illustrated in FIG. 1, and the storage device 420 may be the second electronic device 120 illustrated in FIG. 1.

In some example embodiments, the host 410 may include an application processor (not shown) when the storage system 400 is implemented in a mobile electronic system.

The storage device 420 may include a memory controller 421, a nonvolatile memory 423, and an interface circuit 425. The memory controller 421 and interface circuit 425 of the storage device 420 may correspond to the second controller 125 and the interface circuit 123, respectively. The interface circuit 425 may include a physical layer PL. Further, the storage device 420 may include other components not shown in FIG. 10.

The memory controller 421 may manage and control overall operations of the storage device 420. In particular, the memory controller 421 may process and manage data exchanged with the host 410 through the interface circuit 425. The storage device 420 may perform its own function according to a control of the memory controller 421.

In some example embodiments, the memory controller 421 may control the storage device 420 according to a power-down signal PD, a lane reset signal RST, and a reference clock signal rCLK, which are provided through the interface circuit 425. For instance, storage device 420 may utilize the reference clock signal rCLK when generating an operation clock signal opCLK (refer to FIG. 5). The memory controller 421 may store data DAT provided from the host 410 through the interface circuit 425 in the nonvolatile memory 423, and may provide data DAT stored in the nonvolatile memory 423 to the host 410 through the interface circuit 425.

In some example embodiments, the memory controller 421 may control the storage device 420 in compliance with the UFS interface protocol. However, example embodiments are not limited thereto. For instance, the memory controller 421 may control the storage device 420 in compliance with one or more of various interface protocols, such as universal serial bus (USB), small computer system interface (SCSI), PCIe, mobile PCIe (M-PCIe), advanced technology attachment (ATA), parallel ATA (PATA), serial ATA (SATA), serial attached SCSI SAS), integrated drive electronics (IDE), and so on.

The nonvolatile memory 423 may store data regardless of whether power is supplied. The nonvolatile memory 423 may store data according to a control of the memory controller 421. Further, the nonvolatile memory 423 may output data according to a control of the memory controller 421.

As discussed above, the interface circuit 425 may include the physical layer PL. The interface circuit 425 may operate in compliance with the interface protocol that uses the physical layer PL. In particular, the interface circuit 425 may output data stored in the nonvolatile memory 423 serially through the physical layer PL.

As an example embodiment, when the storage device 420 is implemented in a mobile electronic system, the physical layer PL may be defined by the M-PHY specification. However, example embodiments are not limited thereto. The physical layer PL may include physical components (e.g., a plurality of transmitters and one or more receivers) for exchanging data with the host 410. In particular, the plurality of transmitters included in the physical layer PL of the interface circuit 425 may be implemented based on one or more of the example embodiments.

More particularly, the physical layer PL of the interface circuits 425 may include at least one of components shown FIGS. 3 through 7. When the transmitters included in the physical layer PL of the interface circuit 425 are used, an effect described with reference to FIG. 9 may be obtained, thus, redundant descriptions will be omitted below for brevity of the description.

In some example embodiments, the memory controller 421, the nonvolatile memory 423, and the interface circuit 425 may be implemented with an embedded storage that is configured to be embedded in a mobile electronic system. In other example embodiments, the memory controller 421, the nonvolatile memory 423, and the interface circuit 425 may be implemented with a card storage that is configured to be connected with a mobile electronic system. However, example embodiments are not limited thereto. The storage device 420 may be implemented with another type of storage.

Figure 11:
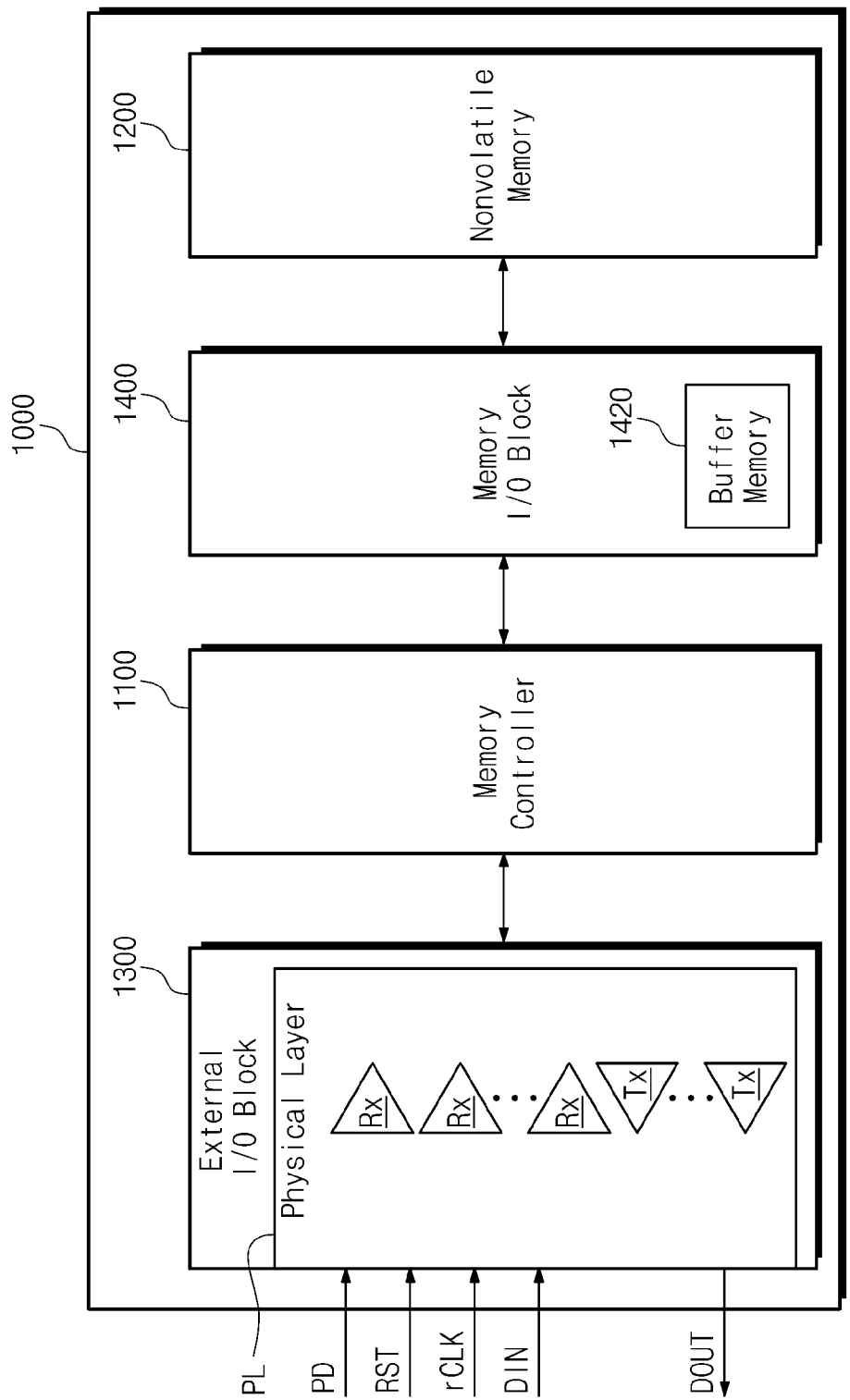
FIG. 11 is a block diagram illustrating an embedded storage according to an example embodiment.

FIG. 11 is a block diagram illustrating an embedded storage according to some example embodiments.

Referring to FIG. 11, an embedded storage 1000 may include a memory controller 1100, a nonvolatile memory 1200, an external input/output block 1300, and a memory input/output block 1400. However, example embodiments are not limited thereto. For example, the embedded storage 1000 may further include other components not illustrated in FIG. 11. Alternatively, the embedded storage 1000 may not include one or more components shown in FIG. 11.

The memory controller 1100 may manage and control overall operations of the embedded storage 1000. In particular, the memory controller 1100 may process and manage data exchanged with a host through the external input/output block 1300.

In some example embodiments, the memory controller 1100 may control the embedded storage 1000 according to a power-down signal PD, a lane reset signal RST, and a reference clock signal rCLK, which are provided through the external input/output block 1300. The memory controller 1100 may store data DIN provided from the host through the external input/output block 1300 in the nonvolatile memory 1200 through the memory input/output block 1400. The memory controller 1100 may provide data DOUT stored in the nonvolatile memory 1200 to the host through the external input/output block 1300.

In some example embodiments, the memory controller 1100 may control the embedded storage 1000 in compliance with the UFS interface protocol. However, example embodiments are not limited thereto. For instance, the memory controller 1100 may control the embedded storage 1000 in compliance with one or more of various interface protocols, such as USB, SCSI, PCIe, M-PCIe, ATA, PATA, SATA, SAS, IDE, and so on.

The nonvolatile memory 1200 is a memory that is configured to perform a function of the embedded storage 1000. The nonvolatile memory 1200 may store data regardless of whether power is supplied. For instance, the nonvolatile memory 1200 may be one of a NAND-type flash memory, a NOR-type flash memory, a phase-change random access memory (PRAM), a magneto-resistive RAM (MRAM), a resistive RAM (ReRAM), a ferro-electric RAM (FRAM), and so on. Alternatively, the nonvolatile memory 1200 may be implemented with various types of memories.

The external input/output block 1300 according to some example embodiments may exchange signals and data with an external device or system. The external input/output block 1300 may include a physical layer PL. The external input/output block 1300 may operate in compliance with the interface protocol that uses the physical layer PL. For example, the external input/output block 1300 may output data stored in the nonvolatile memory 1200 serially through the physical layer PL.

In some example embodiments, when the embedded storage 1000 is implemented in a mobile electronic system, the physical layer PL may be defined by the M-PHY specification. However, example embodiments are not limited thereto. The physical layer PL may include a plurality of transmitters Tx and one or more receivers Rx for exchanging data with the host. In particular, each of the plurality of transmitters Tx included in the physical layer PL of the external input/output block 1300 may be implemented based on one or more of the example embodiments.

More particularly, the physical layer PL of the external input/output block 1300 may include at least one of components shown FIGS. 3 through 7. When the transmitters Tx included in the physical layer PL of the external input/output block 1300 are used, an effect described with reference to FIG. 9 may be obtained, thus, redundant descriptions will be omitted below for brevity of the description.

The memory input/output block 1400 may perform writing data in the nonvolatile memory 1200 and reading data from the nonvolatile memory 1200. For instance, the memory input/output block 1400 may include a buffer memory 1420 for buffering data temporarily. Although not shown in FIG. 11, the memory input/output block 1400 may further include other components for inputting and outputting data, such as an address decoder and a sense amplifier.

Figure 12:
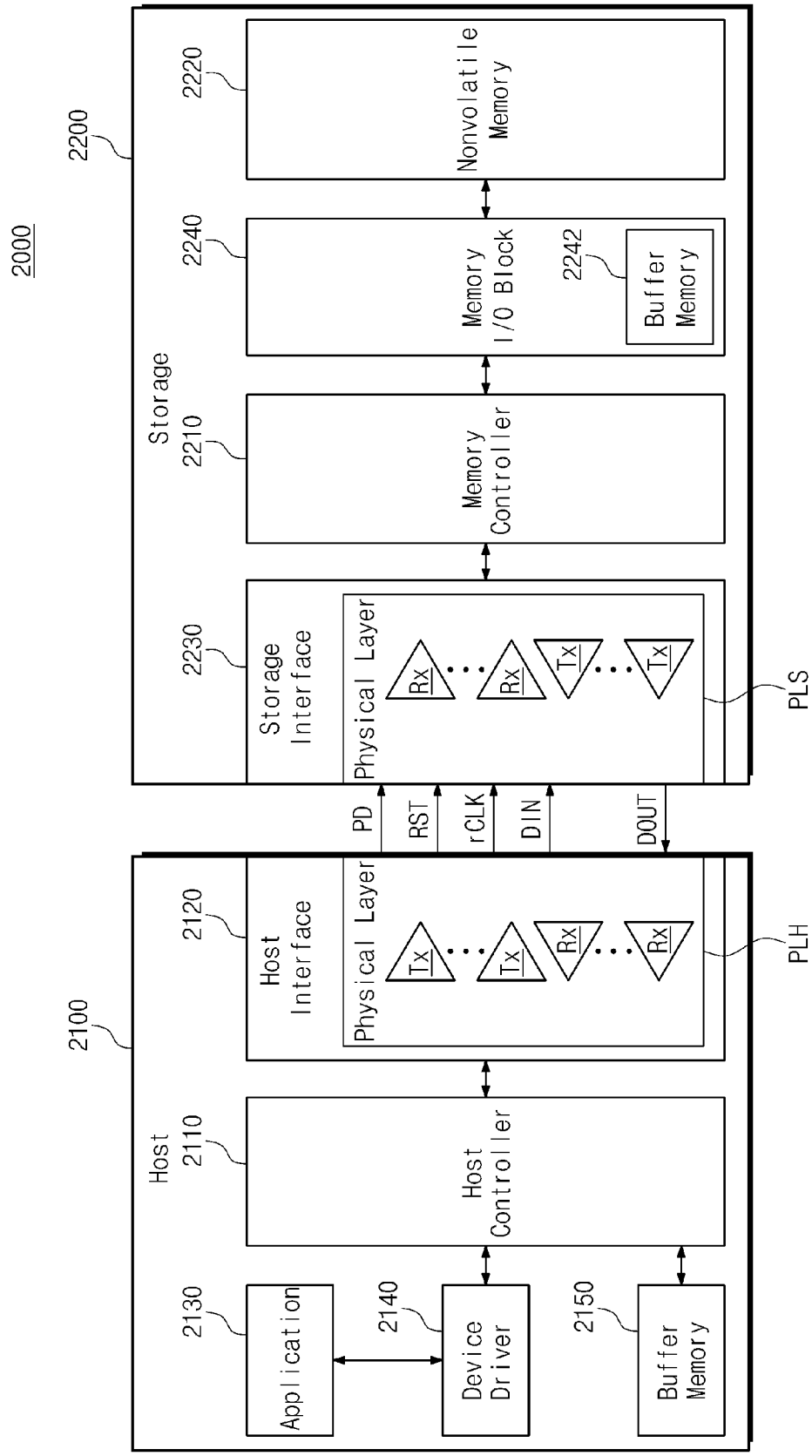
FIG. 12 is a block diagram illustrating a storage system including a card storage according to an example embodiment.

FIG. 12 is a block diagram illustrating a storage system including a card storage according to some example embodiments.

Referring to FIG. 1, a storage system 2000 may include a host 2100 and a card storage 2200.

The host 2100 may include a host controller 2110, a host interface 2120, an application 2130, a device driver 2140, and a buffer memory 2150. However, example embodiments are not limited thereto. For example, the host 2100 may further include other components not shown in FIG. 12.

Alternatively, the host 2100 may not include one or more components shown in FIG. 12.

The host controller 2110 may manage and control overall operations of the host 2100. The host controller 2110 may process and manage data exchanged with the card storage 2200 through the host interface 2120. As an example embodiment, the host controller 2110 may control the host 2100 in compliance with the UFSHCI interface protocol. However, example embodiments are not limited thereto.

The host interface 2120 may provide various kinds of signals (e.g., a power-down signal PD, a lane reset signal RST, and a reference clock signal rCLK) to the card storage 2200. Further, the host interface 2120 may exchange data (e.g., input data DIN and output data DOUT) with the card storage 2200. The host interface 2120 may include a physical layer PLH. The host interface 2120 may communicate with the card storage 2200 in compliance with the interface protocol that uses the physical layer PLH. For example, the host interface 2120 may output data and signals serially through the physical layer PLH.

In some example embodiments, when the storage system 2000 is implemented in a mobile electronic system, the physical layer PLH may be defined by the M-PHY specification. However, example embodiments are not limited thereto. The physical layer PLH may include a plurality of transmitters Tx and one or more receivers Rx for exchanging data with the card storage 2200. In particular, each of the plurality of transmitters Tx included in the physical layer PL of the host interface 2120 may be implemented based on one or more of the example embodiments.

More particularly, the physical layer PLH of the host interface 2120 may include at least one of components shown FIGS. 3 through 7. When the transmitters Tx included in the physical layer PLH of the host interface 2120 are used, an effect described with reference to FIG. 9 may be obtained, thus, redundant descriptions will be omitted below for brevity of the description.

The application 2130 may manage various kinds of application programs executed on the host 2100. The device driver 2140 may manage and drive peripheral devices connected with the host 2100. In FIG. 12, the device driver 2140 may drive the card storage 2200. The application 2130 and the device driver 2140 may be implemented in the form of program instruction (e.g., firmware).

The buffer memory 2150 may temporarily buffer data processed or to be processed by the host 2100. For instance, the buffer memory 2150 may include a nonvolatile memory, such as a flash memory, PRAM, MRAM, ReRAM, or FRAM, and/or a volatile memory, such as a static RAM (SRAM), dynamic RAM (DRAM), or synchronous DRAM (SDRAM).

The card storage 2200 may include a memory controller 2210, a nonvolatile memory 2220, a storage interface 2230, and a memory input/output block 2240. However, example embodiments are not limited thereto. For example, the card storage 2200 may further include other components not illustrated in FIG. 12. Alternatively, the card storage 2200 may not include one or more components shown in FIG. 12.

The memory controller 2210 may manage and control overall operations of the card storage 2200. The memory controller 2210 may process and manage data exchanged with the host 2100 through the storage interface 2230. As an example embodiment, the memory controller 2210 may control the card storage 2200 in compliance with the UFS interface protocol. However, example embodiments are not limited thereto.

For instance, the memory controller 2210 may control the card storage 2200 according to the power-down signal PD, the lane reset signal RST, and the reference clock signal rCLK, which are provided from the host 2100 through the storage interface 2230. For instance, the memory controller 2210 may store the data DIN provided from the host 2100 through the storage interface 2230 in the nonvolatile memory 2220 through the memory input/output block 2240. Further, the memory controller 2210 may provide the data DOUT stored in the nonvolatile memory 2220 to the host 2100 through the storage interface 2230.

The nonvolatile memory 2220 is a memory that is configured to perform a function of the card storage 2200. The nonvolatile memory 2220 may store data regardless of whether power is supplied. For instance, the nonvolatile memory 2220 may be one of a NAND-type flash memory, a NOR-type flash memory, a PRAM, an MRAM, a ReRAM, an FRAM, and so on. Alternatively, the nonvolatile memory 2220 may be implemented with various types of memories.

The storage interface 2230 may receive various kinds of signals (e.g., the power-down signal PD, the lane reset signal RST, and the reference clock signal rCLK) from the host 2100. Further, the storage interface 2230 may exchange data (e.g., the input data DIN and the output data DOUT) with the host 2100. The storage interface 2230 may include a physical layer PLS. The storage interface 2230 may operate in compliance with the interface protocol that uses the physical layer PLS. For example, the storage interface 2230 may output data stored in the nonvolatile memory 2220 serially through the physical layer PLS.

In some example embodiments, when the storage system 2000 is implemented in a mobile electronic system, the physical layer PLS may be defined by the M-PHY specification. However, example embodiments not limited thereto. The physical layer PLS may include a plurality of transmitters Tx and one or more receivers Rx for exchanging data with the host 2100. In particular, each of the plurality of transmitters Tx included in the physical layer PLS of the storage interface 2230 may be implemented based on one or more of the example embodiments.

More particularly, the physical layer PLH of the storage interface 2230 may include at least one of components shown FIGS. 3 through 7. When the plurality of transmitters Tx included in the physical layer PLH of the storage interface 2230 are used, an effect described with reference to FIG. 9 may be obtained, thus, redundant descriptions will be omitted below for brevity of the description.

The memory input/output block 2240 may perform writing data in the nonvolatile memory 2220 and reading data from the nonvolatile memory 2220. For instance, the memory input/output block 2240 may include a buffer memory 2242 for buffering data temporarily. The buffer memory 2242 may include a nonvolatile memory, such as a flash memory, PRAM, MRAM, ReRAM, or FRAM, and/or a volatile memory, such as a SRAM, DRAM, or SDRAM. Although not shown in FIG. 12, the memory input/output block 2240 may further include other components for inputting and outputting data, such as an address decoder and a sense amplifier.

A configuration of a storage device that is implemented based on some example embodiments has been described with reference to FIGS. 11 and 12. However, as described above, example embodiments may be applied to all interface circuits that use a physical layer, and, therefore FIGS. 11 and 12 do not limit the example embodiments.

Figure 13:
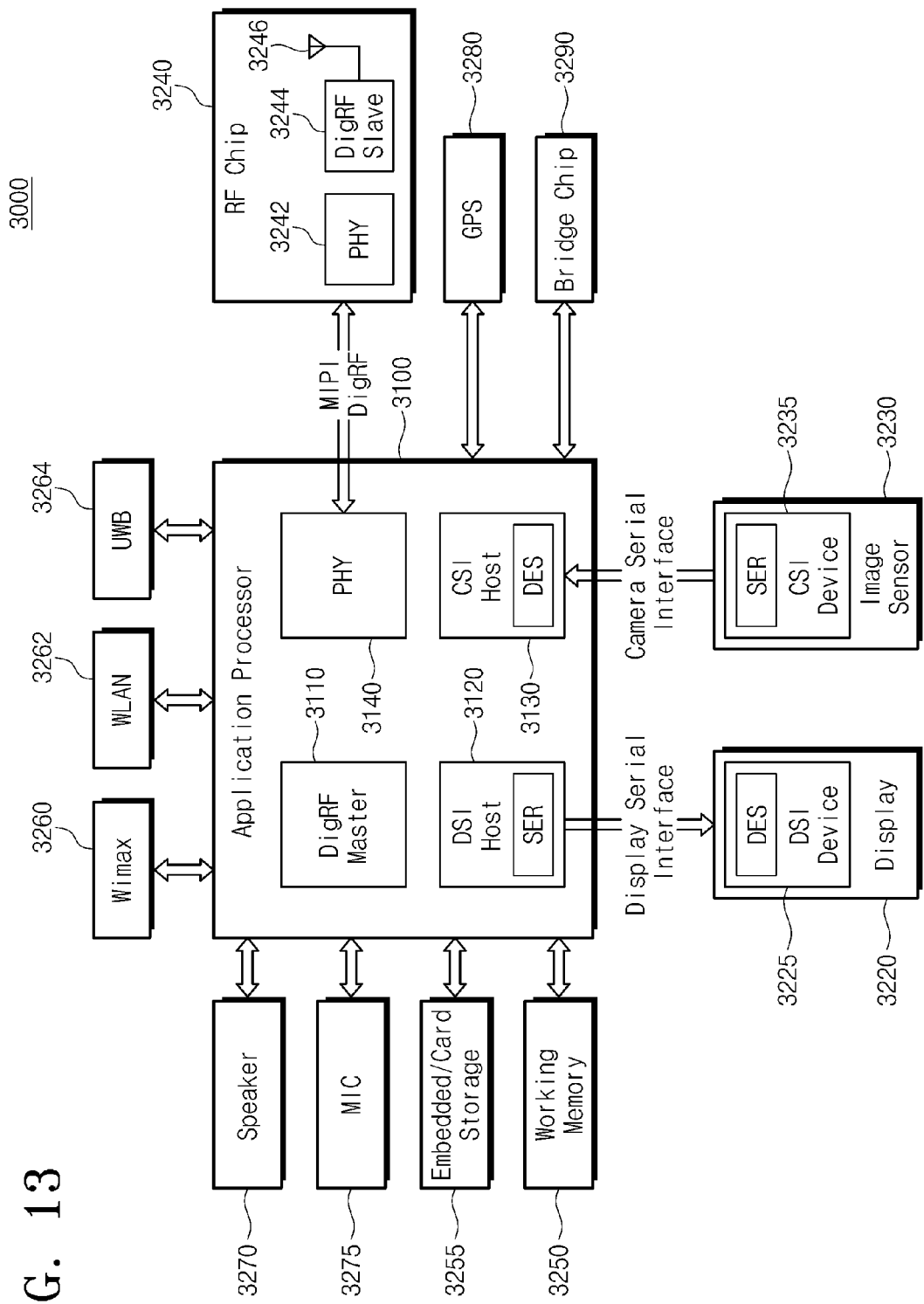
FIG. 13 is a block diagram illustrating an electronic system including a transmitting circuit according to an example embodiment and interfaces operating according to an example embodiment.

FIG. 13 is a block diagram illustrating an electronic system including a transmitting circuit and interfaces operating according to some example embodiments.

Referring to FIG. 13, an electronic system 3000 may be implemented with a data processing device (e.g., a cellular phone, personal digital assistant (PDA), portable media player (PMP), smart phone, or wearable device) using or supporting the interface proposed by the MIPI alliance.

The electronic system 3000 may include an application processor 3100, a display 3220, and an image sensor 3230. The application processor 3100 may include a DigRF master 3110, a display serial interface (DSI) host 3120, a camera serial interface (CSI) host 3130, and a physical layer 3140.

The DSI host 3120 may communicate with a DSI device 3225 of the display 3220 according to the DSI. For instance, an optical serializer SER may be implemented in the DSI host 3120, and an optical de-serializer DES may be implemented in the DSI device 3225.

The CSI host 3130 may communicate with a CSI device 3235 of the image sensor 3230 according to the CSI. An optical de-serializer DES may be implemented in the CSI host 3130, and an optical serializer SER may be implemented in the CSI device 3235.

The DSI and the CSI may use a physical layer. The DSI and the CSI may adopt one or more example embodiments. For instance, the physical layer of each of the DSI host 3120 and the DSI device 3225 may include a plurality of transmitters that operate based on a common clock signal. In addition, the physical layer of each of the CSI host 3130 and the CSI device 3235 may include a plurality of transmitters that operate based on a common clock signal using the transmitting circuit 200, 300.

The electronic device 3000 may further include a RF chip 3240 capable of communicating with the application processor 3100. The RF chip 3240 may include a physical layer 3242, a DigRF slave 3244, and an antenna 3246. For instance, the physical layer 3242 of the RF chip 3240 and the physical layer 3140 of the application processor 3100 may exchange data in compliance with the DigRF interface proposed by the MIPI alliance. The DigRF interface may adopt one or more example embodiments. For instance, each of the physical layers 3140 and 3242 may include a plurality of transmitters that operate based on a common clock signal using the transmitting circuit 200, 300.

The electronic system 3000 may further include a working memory 3250 and an embedded/card storage 3255. The working memory 3250 and the embedded/card storage 3255 may store data provided from the application processor 3100. Further, the working memory 3250 and the embedded/card storage 3255 may provide data stored therein to the application processor 3100.

The working memory 3250 may temporarily store data processed or to be processed by the application processor 3100. The working memory 3250 may include a nonvolatile memory, such as a flash memory, PRAM, MRAM, ReRAM, or FRAM, and/or a volatile memory, such as a SRAM, DRAM, or SDRAM.

The embedded/card storage 3255 may store data regardless of whether power is supplied. In some example embodiments, the embedded/card storage 3255 may operate in compliance with the UFS interface protocol. However, example embodiments are not limited thereto. As described with reference to FIGS. 11 and 12, a physical layer of the embedded/card storage 3255 may include a plurality of transmitters that operate based on a common clock signal using the transmitting circuit 200, 300.

The electronic system 3000 may communicate with an external system (not shown) with world interoperability for microwave access (WiMax) 3260, wireless local area network (WLAN) 3262, and ultra wideband (UWB) 3264. A physical layer of the WLAN 3262 may include a plurality of transmitters that operate based on a common clock signal using the transmitting circuit 200, 300.

The electronic system 3000 may further include a speaker 3270 and a microphone 3275 to process voice information. The electronic system 3000 may further include a global positioning system (GPS) device 3280 for processing position information.

The electronic system 3000 may further include a bridge chip 3290 for managing connections with peripheral devices. A physical layer of the bridge chip 3290 may include a plurality of transmitters that operate based on a common clock signal using the transmitting circuit 200, 300.

Configurations illustrated in each conceptual diagram should be understood from a conceptual point of view. Shape, structure, and size of each component shown in a conceptual diagram are exaggerated or downsized to help understanding example embodiments. Actually implemented configurations may be different from those of each conceptual diagram. Each conceptual diagram is not intended to limit the physical shape of the component.

A device configuration shown in each block diagram intends to help understanding example embodiments. Each block may be formed of smaller blocks according to a function. Alternatively, a plurality of blocks may form a larger unit of block according to functions. That is, example embodiments are not limited to components shown in each block diagram.

While example embodiments been described with reference to some of the example embodiments, it will be apparent to those skilled in the art that various changes and/or modifications may be made without departing from the spirit and scope of the example embodiments. Therefore, it should be understood that the above-mentioned example embodiments are not limiting, but illustrative.

What is claimed is:

1. A transmitting circuit comprising:
    a plurality of transmitters each configured to serially output data;
    an operation clock generator configured to generate an operation clock signal; and
    a clock divider configured to divide the operation clock signal to generate a symbol clock signal, wherein the plurality of transmitters is configured to receive the operation clock signal and the symbol clock signal in common, and each of the plurality of transmitters includes,
        a serializer configured to receive parallel data in synchronization with the symbol clock signal, and to serialize the received parallel data to generate serial data in synchronization with the operation clock signal;
        digital logic configured to receive original data, to extract data in symbol units from the original data to generate the parallel data, and to provide the parallel data to the serializer based on the symbol clock signal provided through the serializer such that the serializer receives the parallel data in synchronization with the symbol clock signal; and
        a driver configured to output the serial data.

2. The transmitting circuit of claim 1, wherein each of the plurality of transmitters is configured to independently receive a lane reset signal and a power-down signal, each of the plurality of transmitters is configured to reset a state of a respective lane based on the lane reset signal, and to stop an operation of a respective one of the plurality of transmitters based on the power-down signal, and wherein each of the plurality of transmitters is configured to independently operate based on the lane reset signal and the power-down signal.

3. The transmitting circuit of claim 2, wherein each of the plurality of transmitters further comprises:

an operation clock buffer configured to transmit the operation clock signal to the serializer if the lane reset signal and the power-down signal are a first logic level; and a symbol clock buffer configured to transmit the symbol clock signal to the serializer if the lane reset signal and the power-down signal are the first logic level.

4. The transmitting circuit of claim 3, wherein the operation clock buffer and the symbol clock buffer are configured not to transmit the operation clock signal and the symbol clock signal to the serializer respectively when at least one of the lane reset signal and the power-down signal is a second logic level opposite the first logic level.

5. The transmitting circuit of claim 1, wherein the operation clock generator comprises:

a phase locked loop (PLL) circuit.

6. The transmitting circuit of claim 1, wherein the serializer comprises:

a latch configured to receive the parallel data from the digital logic; and a multiplexer configured to receive the parallel data from the latch, and to generate the serial data based on the parallel data.

7. The transmitting circuit of claim 6, wherein the latch is configured to receive the parallel data in synchronization with the symbol clock signal.

8. The transmitting circuit of claim 6, wherein the multiplexer is configured to serialize the received parallel data to generate the serial data in synchronization with the operation clock signal.

9. The transmitting circuit of claim 1, wherein each of the symbol units is a unit of data having a length of N bits, N is an integer greater than or equal to 1, and a period of the symbol clock signal is N times a period of the operation clock signal.

10. A transmitting circuit comprising:

a common clock circuit configured to output an operation clock signal, and to output a symbol clock signal by dividing the operation clock signal; and a plurality of transmitters configured to receive the operation clock signal and the symbol clock signal in common, each of the plurality of transmitters being configured to, receive original data, generate parallel data by extracting data from the original data in symbol units based on the symbol clock signal, serialize the generated parallel data in synchronization with the operation clock signal to generate serialized data, and output the serialized data.

11. The transmitting circuit of claim 10, wherein each of the plurality of transmitters is configured to independently operate using operation power.

12. The transmitting circuit of claim 11, wherein the plurality of transmitters includes at least a first transmitter and a second transmitter, and the common clock circuit is configured to provide the symbol clock signal to the first transmitter and the second transmitter such that the symbol clock signal provided to the first transmitter and the second transmitter is equally synchronized irrespective of whether a time when the first transmitter begins to operate is different from a time when the second transmitter begins to operate.

13. The transmitting circuit of claim 11, wherein each of the plurality of transmitters is configured to independently receive a lane reset signal and a power-down signal, and each of the plurality of transmitters is configured to reset a state of a respective lane based on the lane reset signal, and to stop an operation of a respective one of the plurality of transmitters based on the power-down signal.

14. The transmitting circuit of claim 13, wherein the plurality of transmitters includes at least a first transmitter and a second transmitter, and the first transmitter is configured to operate, if the lane reset signal or the power-down signal received by the first transmitter both have a first logic level, and the second transmitter is configured to stop operating, if at least one of the lane reset signal and the power-down signal received by the second transmitter has a second logic level different from the first logic level.

15. The transmitting circuit of claim 10, wherein the transmitting circuit is included in a physical layer which is defined based on a mobile industry processor interface (MIPI) M-PHY specification.

16. A storage device comprising:

a memory controller;

a nonvolatile memory configured to store data according to a control of the memory controller; and an interface circuit configured to serially output the stored data in compliance with an interface protocol that uses a physical layer, the interface circuit including, a plurality of transmitters included in the physical layer, each of the plurality of transmitters being configured to serially output data, and a common clock circuit configured to generate an operation clock signal, to divide the operation clock signal to generate a symbol clock signal, and to provide the operation clock signal and the symbol clock signal to the plurality of transmitters in common, wherein each of the plurality of transmitters is configured to, receive the stored data, generate parallel data by extracting data from the received data in symbol units based on the symbol clock signal, generate serial data by serializing the generated parallel data in synchronization with the operation clock signal, and output the serial data.

17. The storage device of claim 16, wherein each of the plurality of transmitters comprises:

a serializer configured to receive the parallel data in synchronization with the symbol clock signal, and to generate the serial data by serializing the received parallel data in synchronization with the operation clock signal;

digital logic configured to receive the stored data, to generate the parallel data by extracting the data from the received data in the symbol units based on the symbol clock signal, and to provide the parallel data to the serializer based on the symbol clock signal such that the serializer receives the parallel data in synchronization with the symbol clock signal; and a driver configured to output the serial data.

18. The storage device of claim 17, wherein the digital logic is configured to receive the symbol clock signal through the serializer.

19. The storage device of claim 16, wherein each of the plurality of transmitters is configured to independently operate based on a lane reset signal and a power-down signal, each of the plurality of transmitters being configured to reset a state of a respective lane based on the lane reset signal, and to stop an operation of a respective one of the plurality of transmitters based on the power-down signal, and the common clock circuit is configured to provide the symbol clock signal to each of the plurality of transmitters such that the symbol clock signal provided to each of the plurality of transmitters is equally synchronized irrespective of whether one or more of the plurality of transmitters begins to operate at a different time from a rest of the plurality of transmitters.

20. The storage device of claim 16, wherein the physical layer is defined based on a mobile industry processor interface (MIPI) M-PHY specification, the memory controller is configured to exchange data with the nonvolatile memory in compliance with an universal flash storage (UFS) interface protocol, and the memory controller, the nonvolatile memory, and the interface circuit are implemented with one of an embedded storage embedded in a mobile electronic system, or a card storage configured to connect to the mobile electronic system.

* * * * *